United States Patent
You et al.

(10) Patent No.: US 11,482,509 B2
(45) Date of Patent: Oct. 25, 2022

(54) SEMICONDUCTOR PACKAGE

(71) Applicant: Samsung Electronics Co., Ltd., Suwon-si (KR)

(72) Inventors: Se-Ho You, Seoul (KR); Kyung Suk Oh, Seongnam-si (KR); Sunkyoung Seo, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 16/906,051

(22) Filed: Jun. 19, 2020

(65) Prior Publication Data

US 2021/0167040 A1    Jun. 3, 2021

(30) Foreign Application Priority Data

Dec. 2, 2019  (KR) .................. 10-2019-0158242

(51) Int. Cl.
| | | |
|---|---|---|
| *H01L 23/48* | (2006.01) | |
| *H01L 25/065* | (2006.01) | |
| *H01L 25/18* | (2006.01) | |
| *H01L 21/78* | (2006.01) | |
| *H01L 25/00* | (2006.01) | |

(52) U.S. Cl.
CPC .......... *H01L 25/0657* (2013.01); *H01L 21/78* (2013.01); *H01L 25/18* (2013.01); *H01L 25/50* (2013.01); *H01L 2225/06517* (2013.01); *H01L 2225/06544* (2013.01); *H01L 2225/06572* (2013.01); *H01L 2225/06586* (2013.01); *H01L 2225/06589* (2013.01)

(58) Field of Classification Search
None
See application file for complete search history.

(56) References Cited

U.S. PATENT DOCUMENTS

| | | | |
|---|---|---|---|
| 7,943,428 B2 | 5/2011 | Gambino et al. | |
| 8,563,403 B1 | 10/2013 | Farooq et al. | |
| 9,728,453 B2 | 8/2017 | Tseng et al. | |
| 10,074,667 B1 | 9/2018 | Higashi et al. | |
| 2013/0026652 A1* | 1/2013 | Fujii .................. | H01L 23/3128 257/774 |
| 2018/0226390 A1 | 8/2018 | Kang et al. | |
| 2018/0240797 A1 | 8/2018 | Yokoyama et al. | |
| 2019/0385981 A1* | 12/2019 | Chen ..................... | H01L 25/50 |

FOREIGN PATENT DOCUMENTS

KR    100975332 B1    8/2010

* cited by examiner

*Primary Examiner* — Hung K Vu
(74) *Attorney, Agent, or Firm* — Muir Patent Law, PLLC

(57) ABSTRACT

Disclosed is a semiconductor package comprising a first memory chip including a first semiconductor substrate and a first through structure that penetrates the first semiconductor substrate, a second memory chip that directly contacts a top surface of the first memory chip and includes a second semiconductor substrate and a second through structure that penetrates the second semiconductor substrate, a first dummy chip that directly contacts a top surface of the second memory chip and includes a first conductive via, a second dummy chip that directly contacts a top surface of the first dummy chip and includes a second conductive via, and a logic chip in direct contact with a top surface of the second dummy chip. The logic chip is electrically connected to the first through structure through the second conductive via, the first conductive via, and the second through structure.

20 Claims, 12 Drawing Sheets

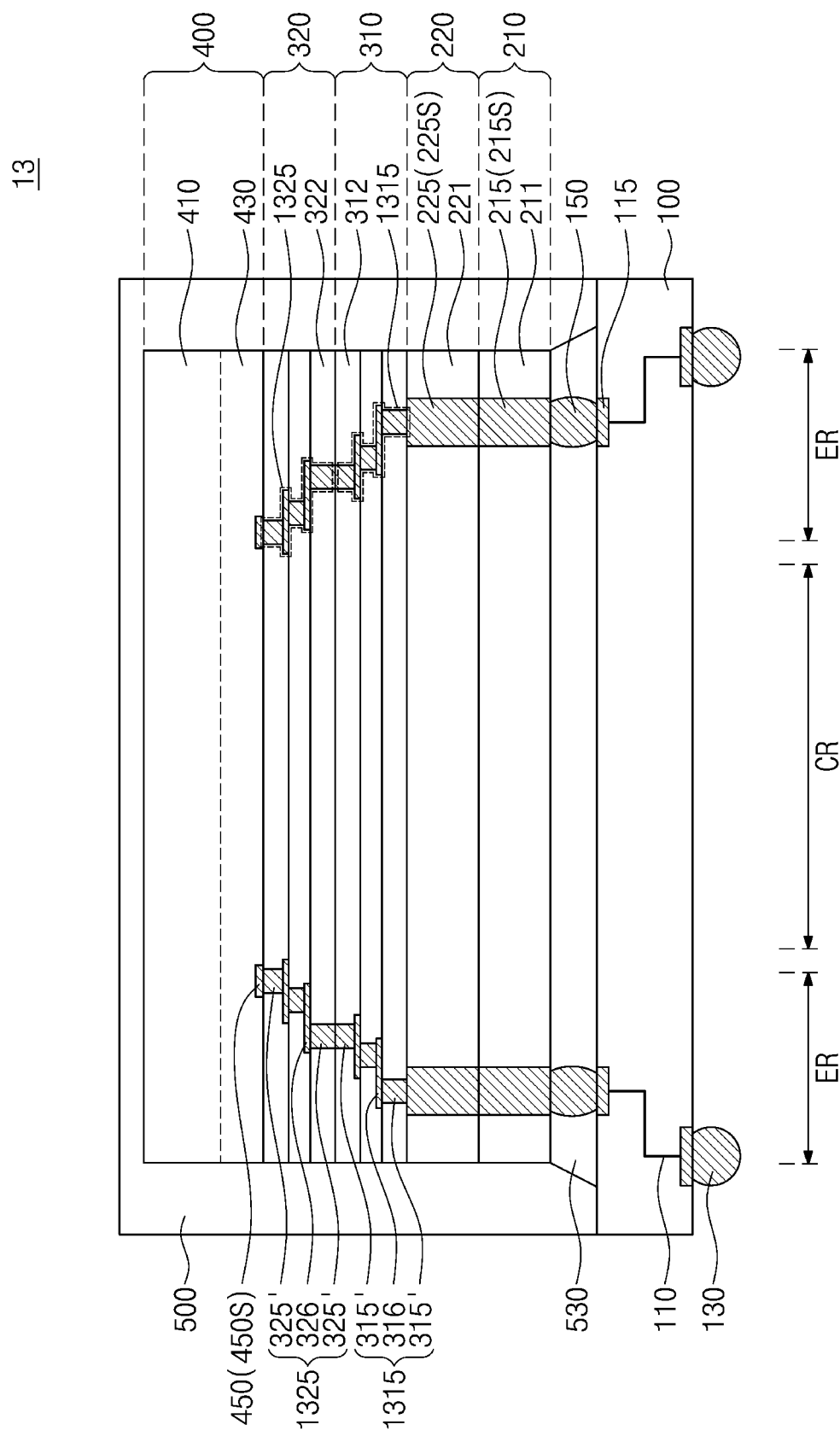

SEMICONDUCTOR PACKAGE

CROSS-REFERENCE TO RELATED APPLICATION

This U.S. nonprovisional application claims priority under 35 U.S.C § 119 to Korean Patent Application No. 10-2019-0158242, filed on Dec. 2, 2019, in the Korean Intellectual Property Office, the disclosure of which is hereby incorporated by reference in its entirety.

BACKGROUND

The present inventive concepts relate to a semiconductor package, and more particularly, to a semiconductor package including stacked semiconductor chips.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of electronic industry, various studies have been conducted to improve reliability and durability of semiconductor packages.

SUMMARY

Some example embodiments of the present inventive concepts provide a semiconductor package with improved thermal characteristics and reliability and a method of fabricating the same.

Some example embodiments of the present inventive concepts provide a compact-sized semiconductor package and a method of fabricating the same.

According to some example embodiments of the present inventive concepts, a semiconductor package may comprise: a first memory chip including a first semiconductor substrate and a first through structure that penetrates the first semiconductor substrate; a second memory chip in direct contact with a top surface of the first memory chip, the second memory chip including a second semiconductor substrate and a second through structure that penetrates the second semiconductor substrate; a first dummy chip in direct contact with a top surface of the second memory chip, the first dummy chip including a first conductive via; a second dummy chip in direct contact with a top surface of the first dummy chip, the second dummy chip including a second conductive via; and a logic chip in direct contact with a top surface of the second dummy chip. The logic chip may be electrically connected to the first through structure through the second conductive via, the first conductive via, and the second through structure.

According to some example embodiments of the present inventive concepts, a semiconductor package may comprise: a package substrate; a first lower integrated circuit chip on the package substrate, the first lower integrated circuit chip including a first semiconductor substrate, first integrated circuits, and a first signal through structure; a second lower integrated circuit chip in direct contact with a top surface of the first lower integrated circuit chip, the second lower integrated circuit chip including a second semiconductor substrate, second integrated circuits, and a second signal through structure that penetrates the second semiconductor substrate; a dummy chip in direct contact a top surface of the second lower integrated circuit chip, the dummy chip including a signal via; and an upper integrated circuit chip on a top surface of the dummy chip, the upper integrated circuit chip including an upper semiconductor substrate and upper integrated circuits. The upper integrated circuits may be of a different type from the first integrated circuits and the second integrated circuits. The first signal through structure, the second signal through structure, and the signal via may overlap an edge region of the first semiconductor substrate. The upper integrated circuit chip may be electrically connected to the first signal through structure through the signal via and the second signal through structure.

According to some example embodiments of the present inventive concepts, a semiconductor package may comprise: a first lower integrated circuit chip including a first semiconductor substrate, first memory circuits, and a first signal through structure that penetrates the first semiconductor substrate; a second lower integrated circuit chip in direct contact with a top surface of the first lower integrated circuit chip, the second lower integrated circuit chip including a second semiconductor substrate, second memory circuits, and a second signal through structure that penetrates the second semiconductor substrate; a first dummy chip in direct contact with a top surface of the second lower integrated circuit chip, the first dummy chip including a first signal via; a second dummy chip in direct contact with a top surface of the first dummy chip, the second dummy chip including a second signal via; and an upper integrated circuit chip in direct contact with a top surface of the second dummy chip, the upper integrated circuit chip including an upper semiconductor substrate and logic circuits. When viewed in plan, the first signal through structure may be provided on an edge region of the first semiconductor substrate. The second signal through structure may be aligned with the first signal through structure. When viewed in plan, the first signal via and the second signal via may overlap the edge region of the first semiconductor substrate. The upper integrated circuit chip may be electrically connected to the first signal through structure through the second signal via, the first signal via, and the second signal through structure.

BRIEF DESCRIPTION OF THE DRAWINGS

FIG. 4 illustrates a cross-sectional view showing a semiconductor package, according to example embodiments.

DETAILED DESCRIPTION OF EMBODIMENTS

Figure 1:
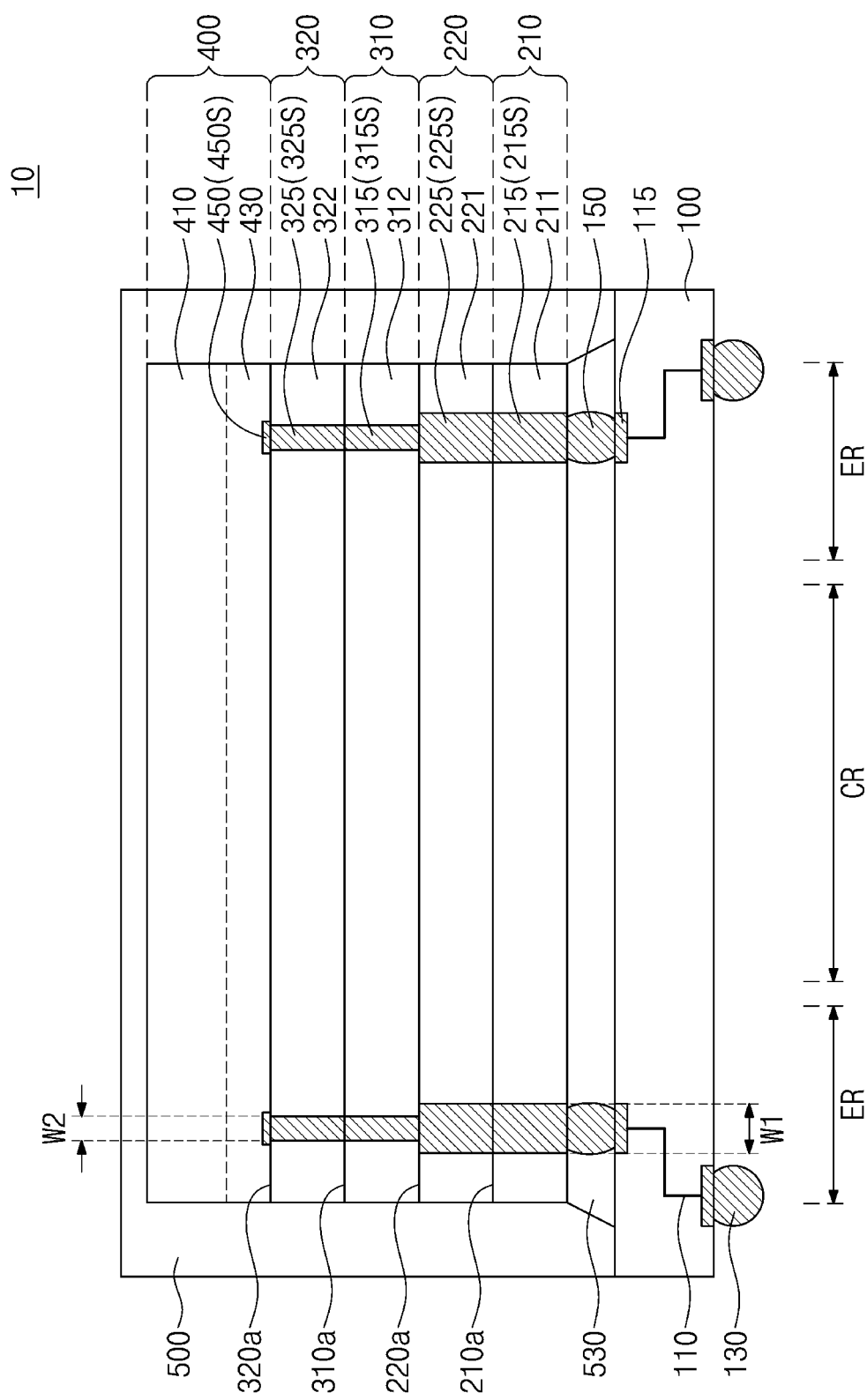
FIG. 1 illustrates a cross-sectional view showing a semiconductor package, according to example embodiments.

In this disclosure, like reference numerals may indicate like components. A connection between conductive elements may be interpreted to include an electrical connection and a physical connection. The following will now describe a semiconductor package and its fabrication method according to the present inventive concepts.

FIG. 1 illustrates a cross-sectional view showing a semiconductor package, according to example embodiments.

Referring to FIG. 1, a semiconductor package 10 may include a package substrate 100, a first lower integrated circuit chip 210, a second lower integrated circuit chip 220, a first dummy chip 310, a second dummy chip 320, and an upper integrated circuit chip 400.

The package substrate 100 may include a printed circuit board or a redistribution layer. A plurality of external terminals 130 may be disposed on a bottom surface of the package substrate 100. A plurality of substrate pads 115 may be disposed on a top surface of the package substrate 100. Each of the substrate pads 115 may be electrically connected to a corresponding one of the external terminals 130 through an internal line 110. The internal line 110 is schematically illustrated. In this disclosure, unless otherwise specially restricted, the description of "electrically connected to the package substrate 100" may mean "electrically connected to the internal line 110."

The first lower integrated circuit chip 210 may be mounted on the top surface of the package substrate 100. The first lower integrated circuit chip 210 may be a front-end-of-line (FEOL) chip that includes a front-end-of-line (FEOL) layer. The first lower integrated circuit chip 210 may include no wiring line layer, and the wiring line layer may be a back-end-of-line (BEOL) layer. Therefore, the first lower integrated circuit chip 210 may have a relatively small thickness.

The first lower integrated circuit chip 210 may include a first semiconductor substrate 211, first integrated circuits (not shown), and a first through structure 215. In some embodiments, the first lower integrated circuit chip 210 may include a plurality of first through structures 215. The first semiconductor substrate 211 may include silicon, germanium, or silicon-germanium. The first semiconductor substrate 211 may have a crystalline structure. For example, the first semiconductor substrate 211 may have a single-crystalline structure. When viewed in plan, the first semiconductor substrate 211 may have a central region CR and an edge region ER. When viewed in plan, the edge region ER of the first semiconductor substrate 211 may be disposed between the central region CR and a lateral surface of the first semiconductor substrate 211. The edge region ER of the first semiconductor substrate 211 may surround the central region CR.

The first lower integrated circuit chip 210 may be a memory chip. For example, the first integrated circuits of the first lower integrated circuit chip 210 may include memory circuits. The first integrated circuits may be provided on a first surface of the first semiconductor substrate 211 and may overlap the central region CR of the first semiconductor substrate 211. When viewed in plan, the first integrated circuits may not be disposed on the edge region ER of the first semiconductor substrate 211. The first surface of the first semiconductor substrate 211 may be an active surface. The first integrated circuits may include transistors.

The first through structure 215 may be provided to penetrate the first semiconductor substrate 211. The first through structure 215 may include a through silicon via. The first through structure 215 may include a conductive material, such as metal. For example, the first through structure 215 may include copper. For another example, the first through structure 215 may include one or more of tungsten, aluminum, titanium, tantalum, and any alloy thereof. Because the first lower integrated circuit chip 210 has a relatively small thickness, the first through structure 215 may have a relatively small thickness and/or width W1. The width W1 may be the width in the horizontal direction, e.g., a direction parallel to the top surface of the package substrate 100.

The first through structure 215 may include a first signal structure 215S. The term "signal structure" may indicate a through structure that serves as a path along which signals propagate. For example, the first signal structure 215S may serve as a signal transmission path for the upper integrated circuit chip 400. The first signal structure 215S may be provided on the edge region ER of the first semiconductor substrate 211. The first signal structure 215S may not overlap the central region CR of the first semiconductor substrate 211. Therefore, the arrangement of the first integrated circuits may not restrict the placement of the first signal structure 215S.

The package substrate 100 and the first lower integrated circuit chip 210 may be provided therebetween with a connection terminal 150 that is coupled to the substrate pad 115 and the first through structure 215. The connection terminal 150 may include one or more of a solder ball, a bump, and a pillar. The connection terminal 150 may include a conductive material, such as metal. The connection terminal 150 may include, for example, one or more of tin, silver, bismuth, and any alloy thereof.

An under-fill layer 530 may be provided in a gap between the package substrate 100 and the first lower integrated circuit chip 210, thereby encapsulating the connection terminal 150. The under-fill layer 530 may include a dielectric polymer. For another example, the under-fill layer 530 may be omitted.

The second lower integrated circuit chip 220 may be disposed on a top surface 210a of the first lower integrated circuit chip 210. The second lower integrated circuit chip 220 may be in direct contact with the top surface 210a of the first lower integrated circuit chip 210. For example, any intervening element, such as solder balls, bumps, pillars, and an under-fill pattern, may not be interposed between the top surface 210a of the first lower integrated circuit chip 210 and a bottom surface of the second lower integrated circuit chip 220. Accordingly, the semiconductor package 10 may become compact-sized. The second lower integrated circuit chip 220 may have a width substantially the same as that of the first lower integrated circuit chip 210. For example, side surfaces of the second lower integrated circuit chip 220 may be vertically aligned with side surfaces of the first lower integrated circuit chip 210.

The second lower integrated circuit chip 220 may be directly bonded to the first lower integrated circuit chip 210. The phrase "directly bonded," with reference to two chips being bonded to each other, may include the meaning of "facing conductive elements of the two chips are directly bonded to each other" and the meaning of "facing dielectric elements of the two chips are directly bonded to each other." The phrase "dielectric elements are directly bonded to each other" may include but not limited to the meaning of "a chemical bond is formed between the dielectric elements." The conductive element may include one or more of a conductive via, a through structure, and a chip pad. The dielectric element may include one or more of a dielectric layer, a dielectric pattern, and a semiconductor substrate.

The second lower integrated circuit chip 220 may be a front-end-of-line (FEOL) chip that includes a front-end-of-line (FEOL) layer. The second lower integrated circuit chip 220 may not include a back-end-of-line (BEOL) layer. Therefore, the second lower integrated circuit chip 220 may have a relatively small thickness. The second lower integrated circuit chip 220 may include a second semiconductor substrate 221, second integrated circuits (not shown), and a second through structure 225. In some embodiments, the second lower integrated circuit chip 220 may include a plurality of second through structures 225. The second semiconductor substrate 221 may include silicon, germanium, or silicon-germanium. The second semiconductor substrate 221 may have a crystalline structure. For example, the second semiconductor substrate 221 may have a single-crystalline structure.

The second lower integrated circuit chip 220 may be of the same type as that of the first lower integrated circuit chip 210. For example, the second lower integrated circuit chip 220 may be a memory chip. The second lower integrated circuit chip 220 may have substantially the same storage capacity as that of the first lower integrated circuit chip 210, but the present inventive concepts are not limited thereto. The second integrated circuits may include memory circuits. The second integrated circuits may be provided on a first surface of the second semiconductor substrate 221. The first surface of the second semiconductor substrate 221 may act as an active surface, which may correspond to a top or bottom surface of the second semiconductor substrate 221. The second integrated circuits may include transistors. The second integrated circuits may vertically overlap the central region CR of the first semiconductor substrate 211. In this disclosure, the description of "vertical," "vertically," and/or "perpendicular" may mean "substantially vertical/perpendicular to the top surface of the package substrate 100 or to a bottom surface of the first lower integrated circuit chip 210" When viewed in plan, the second integrated circuits may not be disposed on the edge region ER of the first semiconductor substrate 211. For example, the second integrated circuits of the second lower integrated circuit chip 220 may not vertically overlap the edge region ER of the first semiconductor substrate 211.

The second through structure 225 may be provided to penetrate the second semiconductor substrate 221. The second through structure 225 may include a through silicon via. Because the second lower integrated circuit chip 220 has a relatively small thickness, the second through structure 225 may have a relatively small thickness and/or width (e.g., width in the horizontal direction). The second through structure 225 may be vertically aligned with the first through structure 215. The second through structure 225 may have a bottom surface in direct contact with a top surface of the first through structure 215. The second through structure 225 may be directly connected to the first through structure 215. In a procedure in which the second through structure 225 is joined with the first through structure 215, a lower portion of the second through structure 225 and an upper portion of the first through structure 215 may be melted such that the second through structure 225 and the first through structure 215 may constitute a unitary structure. In this case, an indistinct interface may be provided between the second through structure 225 and the first through structure 215, but the present inventive concepts are not limited thereto. In this disclosure, the terms "directly bonded," "directly connected," and/or "directly coupled," when referring to two conductive elements, may include the meaning of "joined surfaces of the two elements are in direct contact with each other in a bonding procedure", the meaning of "at least portions of joined surface of the two elements are melted and combined with each other in bonding procedure", and/or the meaning of "the two elements constitute a unitary structure in bonding procedure." Even when two conductive elements are directly bonded to constitute a unitary structure, it may be understood that the two conductive elements are in direct contact with each other. The second through structure 225 may have a width substantially the same as the width W1 of the first through structure 215. In this disclosure, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

The second through structure 225 may include a second signal structure 225S. The second signal structure 225S may serve as a signal transmission path for the upper integrated circuit chip 400. When viewed in plan, the second signal structure 225S may overlap the edge region ER of the first semiconductor substrate 211. The second signal structure 225S may not overlap the central region CR of the first semiconductor substrate 211. The second signal structure 225S may be electrically connected to the first signal structure 215S. Therefore, the arrangement of the second integrated circuits may not restrict the placement of the second signal structure 225S. The second through structure 225 may include a conductive material, such as metal. For example, the second through structure 225 may include one or more of copper, tungsten, titanium, tantalum, and any alloy thereof.

The first dummy chip 310 may be disposed on a top surface 220a of the second lower integrated circuit chip 220. The first dummy chip 310 may be in direct contact with the top surface 220a of the second lower integrated circuit chip 220. The first dummy chip 310 may be directly bonded to the second lower integrated circuit chip 220. For example, any intervening element, such as solder balls, bumps, pillars, and an under-fill pattern, may not be interposed between the first dummy chip 310 and the top surface 220a of the second lower integrated circuit chip 220. Accordingly, the semiconductor package 10 may become compact-sized. The first dummy chip 310 may have a width substantially the same as that of the first lower integrated circuit chip 210 and that of the second lower integrated circuit chip 220. For example, side surfaces of the first dummy chip 310 may be vertically aligned with side surfaces of the first and second lower integrated circuit chips 210 and 220.

The first dummy chip 310 may be a back-end-of-line (BEOL) chip. The first dummy chip 310 may include a wiring line layer, and the wiring line layer may be a back-end-of-line (BEOL) layer. The first dummy chip 310 may include none of integrated circuits and a crystalline semiconductor substrate. The first dummy chip 310 may not contribute to generate signals or to process signals for the semiconductor package 10, but may be provided as an electrical connection path.

The first dummy chip 310 may include a first dielectric layer 312 and a first conductive via 315. In some embodiments, the first dummy chip 310 may include a plurality of first conductive vias 315. The first dielectric layer 312 may include a silicon-based dielectric material or a dielectric polymer. For example, the silicon-based dielectric material may include one or more of silicon oxide, silicon nitride, silicon oxynitride, and silicon carboxide. The first dielectric layer 312 may include an amorphous material. The first dielectric layer 312 may be a single layer or a multiple layer.

The first conductive via 315 may be provided to penetrate the first dielectric layer 312. The first conductive via 315 may have top and bottom surfaces that are exposed respectively on top and bottom surfaces of the first dummy chip 310. The first conductive via 315 may be vertically aligned with the second through structure 225. The bottom surface of the first conductive via 315 may be in direct contact with a top surface of the second through structure 225. The first conductive via 315 may be directly bonded to the second through structure 225. For example, the second through structure 225 and the first conductive via 315 may constitute a unitary structure, and an indistinct interface may be provided between the second through structure 225 and the first conductive via 315, but the present inventive concepts are not limited thereto. The first conductive via 315 may have a width less than the width W1 of the first through structure 215 and the width of the second through structure 225. Because the first conductive via 315 has a relatively small width, the first dummy chip 310 may decrease in parasitic capacitance and the semiconductor package 10 may increase in performance. The first conductive via 315 may include metal, such as copper. For another example, the first conductive via 315 may include one or more of tungsten, titanium, tantalum, and any alloy thereof.

The first conductive via 315 may include a first signal via 315S. The first signal via 315S may serve as a signal transmission path for the upper integrated circuit chip 400. When viewed in plan, the first signal via 315S may overlap the edge region ER of the first semiconductor substrate 211. The first signal via 315S may not overlap the central region CR of the first semiconductor substrate 211. The first signal via 315S may be electrically connected to the second signal structure 225S.

The second dummy chip 320 may be disposed on a top surface 310a of the first dummy chip 310. The second dummy chip 320 may be in direct contact with the top surface 310a of the first dummy chip 310. For example, any intervening element, such as solder balls, bumps, pillars, and an under-fill pattern, may not be interposed between the second dummy chip 320 and the top surface 310a of the first dummy chip 310. Accordingly, the semiconductor package 10 may become compact-sized. The second dummy chip 320 may be directly bonded to the first dummy chip 310. The second dummy chip 320 may have a width substantially the same as that of the first lower integrated circuit chip 210, that of the second lower integrated circuit chip 220, and that of the first dummy chip 310. For example, side surfaces of the second dummy chip 320 may be vertically aligned with side surfaces of the first dummy chip 310, the first lower integrated circuit chip 210, and the second lower integrated circuit chip 220.

The second dummy chip 320 may be a back-end-of-line (BEOL) chip. The second dummy chip 320 may be a back-end-of-line (BEOL) layer. The second dummy chip 320 may include none of integrated circuits and a crystalline semiconductor substrate. The second dummy chip 320 may not contribute to generate signals or to process signals for the semiconductor package 10, but may be provided as an electrical connection path.

The second dummy chip 320 may include a second dielectric layer 322 and a second conductive via 325. In some embodiments, the second dummy chip 320 may include a plurality of second conductive vias 325. The second dielectric layer 322 may include a silicon-based dielectric material or a dielectric polymer. The second dielectric layer 322 may include an amorphous material. Although not shown, the second dielectric layer 322 may be a single layer or a multiple layer.

The second conductive via 325 may be provided to penetrate the second dielectric layer 322. The second conductive via 325 may have top and bottom surfaces that are exposed respectively on top and bottom surfaces of the second dummy chip 320. The second conductive via 325 may be vertically aligned with the first conductive via 315. The bottom surface of the second conductive via 325 may be in direct contact with the top surface of the first conductive via 315. The second conductive via 325 may be directly connected to the first conductive via 315. The second conductive via 325 may have a width W2 substantially the same as that of the first conductive via 315. The width W2 of the second conductive via 325 may be less than the width W1 of the first through structure 215 and the width of the second through structure 225. Accordingly, the second dummy chip 320 may decrease in parasitic capacitance and the semiconductor package 10 may increase in performance. As another example, in some embodiments, the width W2 of the second conductive via 325 may be substantially the same as the width W1 of the first through structure 215. The second conductive via 325 may include metal, such as copper. For another example, the second conductive via 325 may include one or more of tungsten, titanium, tantalum, and any alloy thereof.

The second conductive via 325 may include a second signal via 325S. The second signal via 325S may serve as a signal transmission path for the upper integrated circuit chip 400. When viewed in plan, the second signal via 325S may overlap the edge region ER of the first semiconductor substrate 211. The second signal via 325S may not be provided on the central region CR of the first semiconductor substrate 211. The second signal via 325S may be electrically connected to the first signal via 315S.

The upper integrated circuit chip 400 may be disposed on a top surface 320a of the second dummy chip 320. The upper integrated circuit chip 400 may be in direct contact with the top surface 320a of the second dummy chip 320. For example, any intervening element, such as solder balls, bumps, pillars, and an under-fill pattern, may not be interposed between the upper integrated circuit chip 400 and the top surface 320a of the second dummy chip 320. Accordingly, the semiconductor package 10 may become compact-sized. The upper integrated circuit chip 400 may be directly bonded to the second dummy chip 320. The upper integrated circuit chip 400 may have a width substantially the same as each of those of the first lower integrated circuit chip 210, the second lower integrated circuit chip 220, the first dummy chip 310, and the second dummy chip 320. For example, side surfaces of the upper integrated circuit chip 400 may be vertically aligned with side surfaces of the first and second dummy chips 310 and 320 and side surfaces of the first and second lower integrated circuit chips 210 and 220.

The upper integrated circuit chip 400 may include a chip pad 450, an upper semiconductor substrate 410, a wiring line layer 430, and upper integrated circuits (not shown). The wiring line layer 430 may include a back-end-of-line (BEOL) layer. For example, the upper integrated circuit chip 400 may include a front-end-of-line (FEOL) layer and a back-end-of-line (BEOL) layer. The upper semiconductor substrate 410 may include silicon, germanium, or silicon-germanium. The upper semiconductor substrate 410 may have a crystalline structure (e.g., single-crystalline structure).

The upper integrated circuit chip 400 may be of a different type from that of the first and second lower integrated circuit chips 210 and 220. The upper integrated circuit may be of a different type from that of the first and second integrated circuits. According to example embodiments, the upper integrated circuits may include logic circuits, and the upper integrated circuit chip 400 may be a logic chip. The upper integrated circuits may include transistors. When the semiconductor package 10 operates, a logic chip may generate heat more than that of a memory chip. According to some embodiments, the upper integrated circuit chip 400 may be an uppermost chip. For example, the first and second lower integrated circuit chips 210 and 220 and the first and second dummy chips 310 and 320 may be stacked in the foregoing sequence, and the upper integrated circuit chip 400 may be disposed on the top surface 320a of the second dummy chip 320. In this configuration, heat generated from the upper integrated circuit chip 400 may be easily discharged to the outside. Accordingly, the semiconductor package 10 may increase in operational reliability.

The chip pad 450 may be disposed and exposed on a bottom surface of the upper integrated circuit chip 400. The chip pad 450 may include a signal pad 450S and have electrical connection with the upper integrated circuits. When viewed in plan, the chip pad 450 may overlap the edge region ER of the first semiconductor substrate 211 and may be vertically aligned with the second conductive via 325. The chip pad 450 may have a bottom surface in direct contact with and directly bonded to the top surface of the second conductive via 325. The chip pad 450 may include one or more of copper, aluminum, tungsten, titanium, tantalum, and any alloy thereof.

The upper integrated circuit chip 400 may be electrically connected to the package substrate 100 through the second conductive via 325, the first conductive via 315, the second through structure 225, and the first through structure 215. For example, when the semiconductor package 10 operates, an electrical signal generated from the upper integrated circuits of the upper integrated circuit chip 400 may be transferred through the signal pad 450S, the second signal via 325S, the first signal via 315S, the second signal structure 225S, the first signal structure 215S, the connection terminal 150, the package substrate 100, and the external terminal 130. Because the second conductive via 325, the first conductive via 315, the second through structure 225, and the first through structure 215 are vertically aligned with each other, a reduced electrical path may be provided between the upper integrated circuit chip 400 and the package substrate 100. As a result, the semiconductor package 10 may increase in performance and operating speed.

The semiconductor package 10 may further include a molding layer 500. The package substrate 100 may be provided on its top surface with the molding layer 500 that covers the first lower integrated circuit chip 210, the second lower integrated circuit chip 220, the first dummy chip 310, the second dummy chip 320, and the upper integrated circuit chip 400. For example, the molding layer 500 may be formed on the vertical side surfaces of each of the first lower integrated circuit chip 210, the second lower integrated circuit chip 220, the first dummy chip 310, the second dummy chip 320, and the upper integrated circuit chip 400, and formed on the top surface of the upper integrated circuit chip 400. The molding layer 500 may not extend between the first lower integrated circuit chip 210 and the second lower integrated circuit chip 220, between the second lower integrated circuit chip 220 and the first dummy chip 310, between the first dummy chip 310 and the second dummy chip 320, and between the second dummy chip 320 and the upper integrated circuit chip 400. The molding layer 500 may include a dielectric polymer, such as an epoxy-based molding compound.

Differently from that shown, one or both of the under-fill layer 530 and the molding layer 500 may be omitted.

Figure 2:
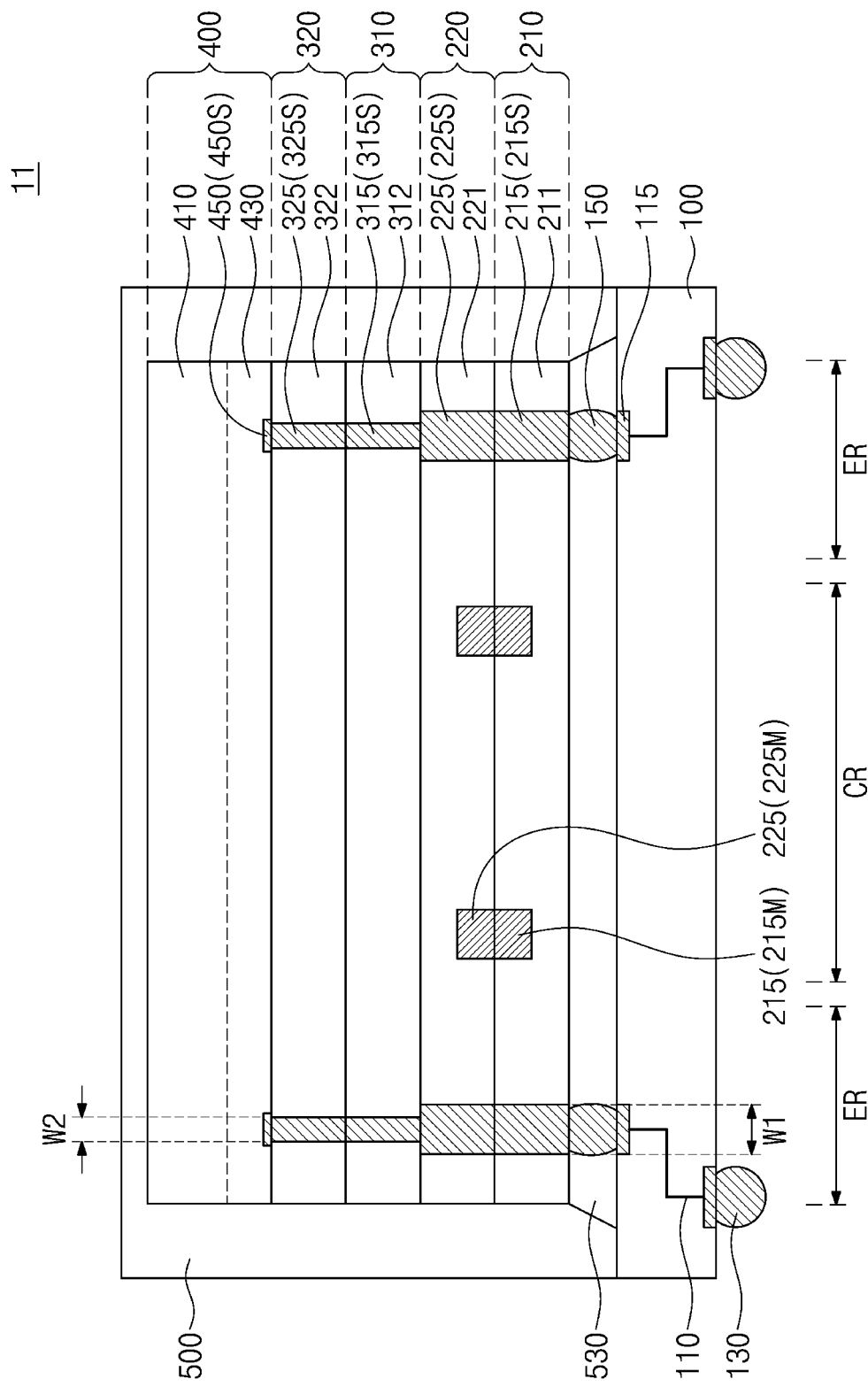
FIG. 2 illustrates a cross-sectional view showing a semiconductor package, according to example embodiments.

FIG. 2 illustrates a cross-sectional view showing a semiconductor package according to some example embodiments. Duplicate descriptions will be omitted below.

Referring to FIG. 2, a semiconductor package 11 may include a package substrate 100, a first lower integrated circuit chip 210, a second lower integrated circuit chip 220, a first dummy chip 310, a second dummy chip 320, and an upper integrated circuit chip 400. The semiconductor package 11 may further include an under-fill layer 530 and a molding layer 500.

The first lower integrated circuit chip 210 may include a first semiconductor substrate 211, first integrated circuits (not shown), and a first through structure 215. In some embodiments, the first lower integrated circuit chip 210 may include a plurality of first through structures 215. The first through structure 215 may be substantially the same as that discussed in FIG. 1. In contrast to FIG. 1, the first through structure 215 may further include a first memory signal structure 215M in addition to the first signal structure 215S. In this disclosure, the description of "memory signal structure" may denote a through structure that serves as a path along which memory signals propagate. The first memory signal structure 215M may penetrate at least a portion of the first lower integrated circuit chip 210. For example, the first memory signal structure 215M may penetrate an upper portion of the central region CR of the first semiconductor substrate 211. The first memory signal structure 215M may be exposed on the top surface of the first lower integrated circuit chip 210. The first memory signal structure 215M may have electrical connection with the first integrated circuits and may serve as an electrical path for the first lower integrated circuit chip 210. The first memory signal structure 215M may be electrically separated from the first signal structure 215S. The first memory signal structure 215M may be electrically separated from the upper integrated circuit chip 400. For example, the first memory signal structure 215M may be electrically isolated from electrical signals transmitted to/from the upper integrated circuit chip 400.

The second lower integrated circuit chip 220 may include a second semiconductor substrate 221, second integrated circuits (not shown), and a second through structure 225. The second through structure 225 may be substantially the same as that discussed in FIG. 1. In contrast to FIG. 1, the second through structure 225 may further include a second memory signal structure 225M in addition to the second signal structure 225S. The second memory signal structure 225M may be electrically connected to the second integrated circuits and may be provided as an electrical path for the second lower integrated circuit chip 220. The second memory signal structure 225M may be electrically separated from the second signal structure 225S. The second memory signal structure 225M may be electrically separated from the upper integrated circuit chip 400. For example, the second memory signal structure 225M may be electrically isolated from electrical signals transmitted to/from the upper integrated circuit chip 400.

The second memory signal structure 225M may penetrate at least a portion of the second lower integrated circuit chip 220. For example, the second memory signal structure 225M may penetrate a lower portion of the second semiconductor substrate 221. The second memory signal structure 225M may be exposed on the bottom surface of the second lower integrated circuit chip 220. The second memory signal structure 225M may have a bottom surface in direct contact with a top surface of the first memory signal structure 215M. The second memory signal structure 225M may be directly bonded to the first memory signal structure 215M.

When the semiconductor package 11 operates, an electrical signal generated from the first lower integrated circuit chip 210 may be transferred to the second lower integrated circuit chip 220 through the first memory signal structure 215M and the second memory signal structure 225M. An electrical signal generated from the second lower integrated circuit chip 220 may be transferred to the first lower integrated circuit chip 210 through the first memory signal structure 215M and the second memory signal structure 225M. The electrical signal may be a memory signal. However, it is not limited that the first and second memory signal structures 215M and 225M are used as electrical paths for memory signals of the first and second lower integrated circuit chips 210 and 220. Any other elements may be employed as the memory signal paths of the first and second lower integrated circuit chips 210 and 220.

The package substrate 100, the first dummy chip 310, the second dummy chip 320, the upper integrated circuit chip 400, the under-fill layer 530, and the molding layer 500 may be the same as those discussed above in FIG. 1.

Figure 3A:
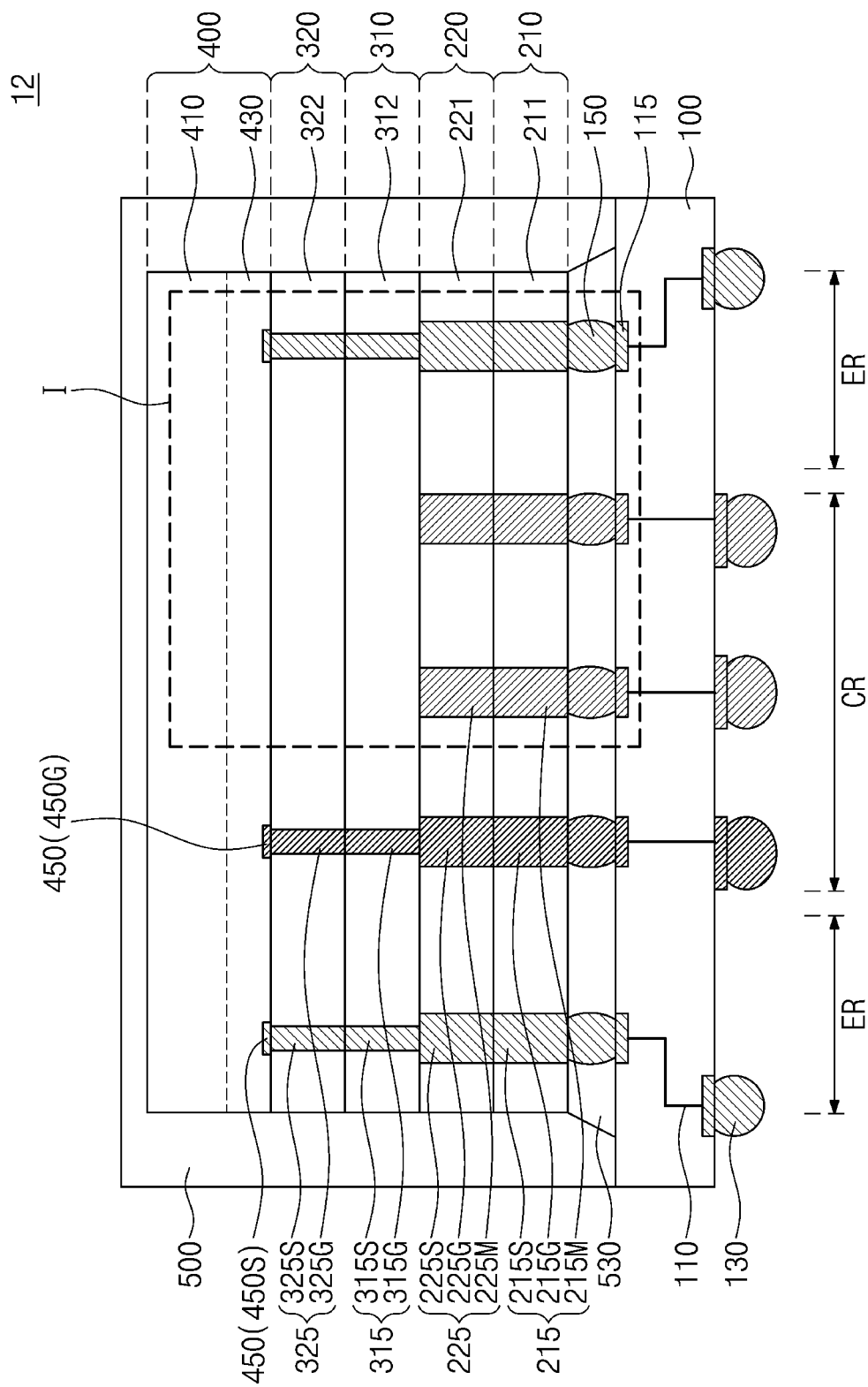
FIG. 3A illustrates a cross-sectional view showing a semiconductor package, according to example embodiments.
Figure 3B:
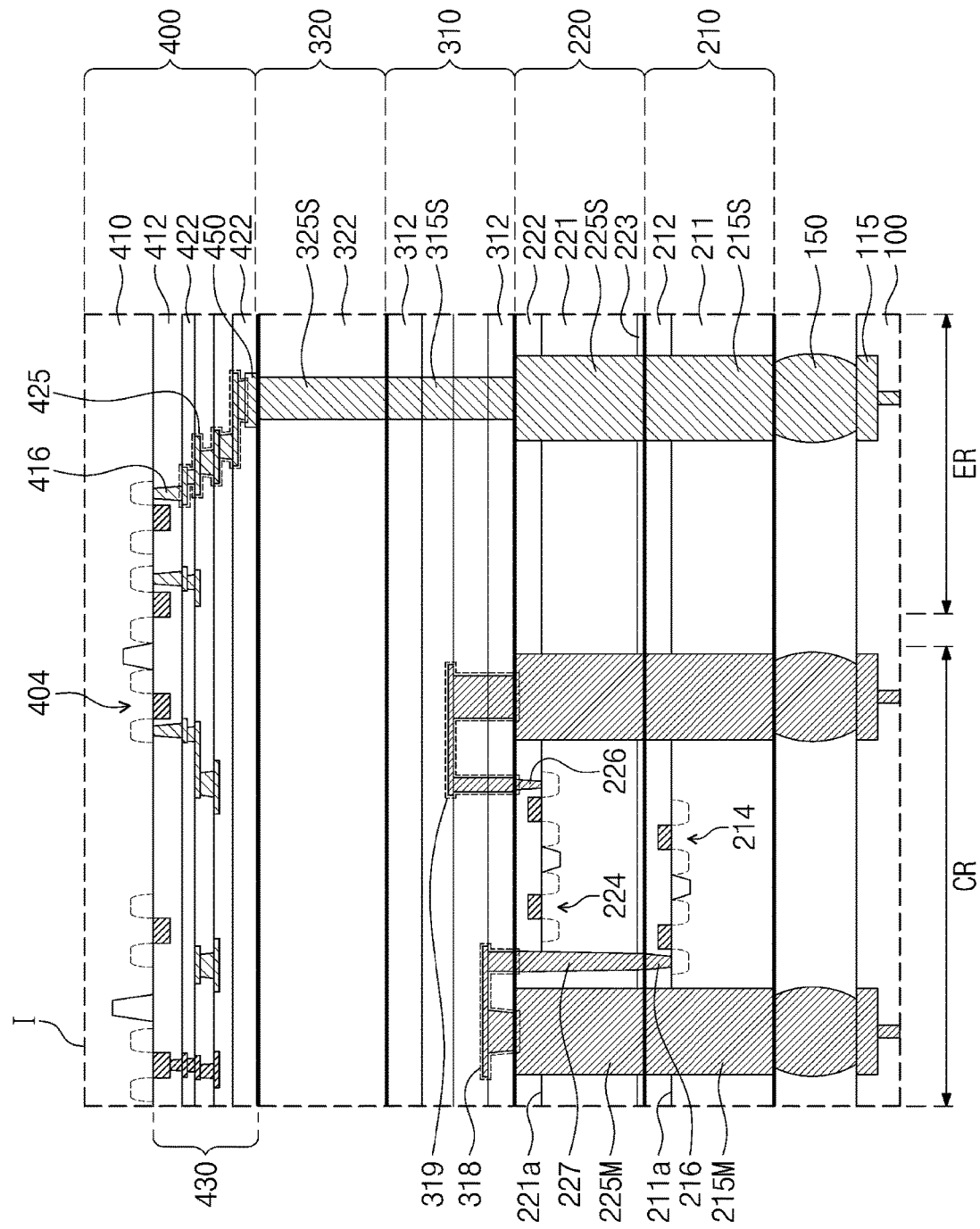
FIG. 3B illustrates an enlarged view showing section I of FIG. 3A.

FIG. 3A illustrates a cross-sectional view showing a semiconductor package, according to example embodiments. FIG. 3B illustrates an enlarged view showing section I of FIG. 3A. Duplicate descriptions will be omitted below.

Referring to FIGS. 3A and 3B, a semiconductor package 12 may include a package substrate 100, a first lower integrated circuit chip 210, a second lower integrated circuit chip 220, a first dummy chip 310, a second dummy chip 320, and an upper integrated circuit chip 400. The semiconductor package 12 may further include an under-fill layer 530 and a molding layer 500. Unless otherwise specified below, the package substrate 100, the first lower integrated circuit chip 210, the second lower integrated circuit chip 220, the first dummy chip 310, the second dummy chip 320, the upper integrated circuit chip 400, the under-fill layer 530, and the molding layer 500 may be substantially the same as those discussed above.

The first through structure 215 of the first lower integrated circuit chip 210 may include a first ground/power structure 215G in addition to the first signal structure 215S and the first memory signal structure 215M. In this disclosure, the description of "ground/power structure" may denote a through structure that serves as a path along which a ground or power voltage is provided. Unless otherwise specified below, the first signal structure 215S may be substantially the same as that discussed above. The first ground/power structure 215G may be insulated from the first signal structure 215S and the first memory signal structure 215M. The first ground/power structure 215G may penetrate the central region CR of the first semiconductor substrate 211. The first ground/power structure 215G may be exposed on the top and bottom surfaces of the first lower integrated circuit chip 210. For example, the first ground/power structure 215G may have top and bottom surfaces that are coplanar with the top and bottom surfaces, respectively, of the first lower integrated circuit chip 210. The connection terminal 150 may include a plurality of connection terminals 150. One of the connection terminals 150 may be coupled to the first ground/power structure 215G and a corresponding one of the substrate pads 115.

The second through structure 225 of the second lower integrated circuit chip 220 may include a second ground/power structure 225G in addition to the second signal structure 225S and the second memory signal structure 225M. The second ground/power structure 225G may be insulated from the second signal structure 225S and the second memory signal structure 225M. When viewed in plan, the second ground/power structure 225G may overlap the central region CR of the first semiconductor substrate 211. The second ground/power structure 225G may be exposed on the top and bottom surfaces of the second lower integrated circuit chip 220. For example, the second ground/power structure 225G may have top and bottom surfaces that are coplanar with the top and bottom surfaces, respectively, of the second lower integrated circuit chip 220. The second ground/power structure 225G may be vertically aligned with the first ground/power structure 215G. The second ground/power structure 225G may have a bottom surface in direct contact with a top surface of the first ground/power structure 215G. The second ground/power structure 225G may be directly connected to the first ground/power structure 215G.

The first dummy chip 310 may include the first dielectric layer 312 and the first conductive via 315. The first conductive via 315 may include the first signal via 315S and a first ground/power via 315G. The first ground/power via 315G may be insulated from the first signal via 315S. When viewed in plan, the first ground/power via 315G may overlap the central region CR of the first semiconductor substrate 211. The first ground/power via 315G may be exposed on the top and bottom surfaces of the first dummy chip 310. For example, the first ground/power via 315G may have top and bottom surfaces that are coplanar with the top and bottom surfaces, respectively, of the first dummy chip 310. The first ground/power via 315G may be vertically aligned with the second ground/power structure 225G. The first ground/power via 315G may have a bottom surface in direct contact with a top surface of the second ground/power structure 225G. The first ground/power via 315G may be directly connected to the second ground/power structure 225G.

The second dummy chip 320 may include the second dielectric layer 322 and the second conductive via 325. The second conductive via 325 may include the second signal via 325S and a second ground/power via 325G. The second ground/power via 325G may be insulated from the second signal via 325S. When viewed in plan, the second ground/power via 325G may overlap the central region CR of the first semiconductor substrate 211. The second ground/power via 325G may be vertically aligned with the second ground/power structure 225G. The second ground/power via 325G may be exposed on the top and bottom surfaces of the second dummy chip 320. For example, the second ground/power via 325G may have top and bottom surfaces that are coplanar with the top and bottom surfaces, respectively, of the second dummy chip 320. The second ground/power via 325G may have a bottom surface in direct contact with a top surface of the first ground/power via 315G. The second ground/power via 325G may be directly bonded to the first ground/power via 315G.

The chip pad 450 of the upper integrated circuit chip 400 may include a signal pad 450S and a ground/power pad 450G. The signal pad 450S may be substantially the same as the chip pad 450 discussed in the example of FIG. 1 or 2. The ground/power pad 450G may be electrically insulated from the signal pad 450S. The ground/power pad 450G may be electrically connected to upper integrated circuits 404. The ground/power pad 450G may be substantially the chip pad 450 discussed in the example of FIG. 1 or 2 in terms of arrangement and material. In contrast, when viewed in plan, the ground/power pad 450G may overlap the central region CR of the first semiconductor substrate 211. The ground/power pad 450G may be vertically aligned with the second ground/power via 325G. The ground/power pad 450G may have a bottom surface in direct contact with a top surface of the second ground/power via 325G. The ground/power pad 450G may be directly connected to the second ground/power via 325G. Therefore, the upper integrated circuit chip 400 may be connected to the package substrate 100 through the second ground/power via 325G, the first ground/power via 315G, the second ground/power structure 225G, and the first ground/power structure 215G, thereby being supplied with voltage. In this configuration, the second ground/power via 325G, the first ground/power via 315G, the second ground/power structure 225G, and the first ground/power structure 215G may serve as a voltage supply path for the upper integrated circuit chip 400.

The following will describe in detail an electrical connection of the first and second lower integrated circuit chips 210 and 220, according to example embodiments.

The first lower integrated circuit chip 210 may include the first semiconductor substrate 211, first integrated circuits 214, the first through structure 215, a first dielectric pattern 212, and a first contact plug 216. The first integrated circuits 214 may be disposed on a first surface 211*a* of the first semiconductor substrate 211. Structures and types of the first integrated circuits 214 may be variously changed without being limited to that shown. The first semiconductor substrate 211 may be provided on its first surface 211*a* with the first dielectric pattern 212 that covers the first integrated circuits 214. The first dielectric pattern 212 may include a silicon-based dielectric material. Alternatively, the first dielectric pattern 212 may include a polymer. The first contact plug 216 may penetrate the first dielectric pattern 212 and may have electrical connection with the first integrated circuits 214. The first contact plug 216 may be exposed on the top surface of the first lower integrated circuit chip 210. The first lower integrated circuit chip 210 may include no wiring line layer (e.g., a back-end-of-line (BEOL) layer) provided on the first contact plug 216. The first contact plug 216 may include a conductive material, such as metal.

A description of the first memory signal structure 215M may be similar to that of the first memory signal structure 215M discussed above in FIG. 2. In FIG. 3B, the first memory signal structure 215M may penetrate the first semiconductor substrate 211 and the first dielectric pattern 212. The first memory signal structure 215M may have its top and bottom surfaces that are respectively exposed on the top and bottom surfaces of the first lower integrated circuit chip 210. The first memory signal structure 215M may be electrically connected through the corresponding connection terminal 150 to the package substrate 100.

The second lower integrated circuit chip 220 may include the second semiconductor substrate 221, second integrated circuits 224, the second through structure 225, a second lower dielectric pattern a second upper dielectric pattern 222, and a second contact plug 226.

The second integrated circuits 224 may be disposed on a first surface 221*a* of the second semiconductor substrate 221. A structure and type of the second integrated circuits 224 of the second semiconductor substrate 221 may be variously changed without being limited to that shown. The second semiconductor substrate 221 may be provided on its first surface 221*a* with the second upper dielectric pattern 222 that covers the second integrated circuits 224. The second upper dielectric pattern 222 may include a silicon-based dielectric material. The second contact plug 226 may penetrate the second upper dielectric pattern 222 and may have electrical connection with the second integrated circuits 224. The second contact plug 226 may be exposed on the top surface of the second lower integrated circuit chip 220. For example, the second lower integrated circuit chip 220 may include no wiring line layer (e.g., a back-end-of-line (BEOL) layer) on the second contact plug 226. The second contact plug 226 may include a conductive material, such as metal.

The second lower dielectric pattern 223 may be disposed on a second surface of the second semiconductor substrate 221. The second surface of the second semiconductor substrate 221 may face the first surface 211*a*. The second lower dielectric pattern 223 may include the same material as that of the first dielectric pattern 212. The second lower dielectric pattern 223 may include a silicon-based dielectric material or a dielectric polymer. The second lower dielectric pattern 223 may be in physical contact with and be directly bonded to the first dielectric pattern 212. For example, the second lower dielectric pattern 223 and the first dielectric pattern 212 may be connected to each other without an interface therebetween, but the present inventive concepts are not limited thereto.

A description of the second memory signal structure 225M may be similar to that of the second memory signal structure 225M discussed above in FIG. 2. In FIG. 3B, the second memory signal structure 225M may penetrate the second semiconductor substrate 221, the second lower dielectric pattern 223, and the second upper dielectric pattern 222. The second memory signal structure 225M may have its top and bottom surfaces that are respectively exposed on the top and bottom surfaces of the second lower integrated circuit chip 220.

The second lower integrated circuit chip 220 may further include a connection through structure 227. The connection through structure 227 may penetrate the second semiconductor substrate 221, the second lower dielectric pattern 223, and the second upper dielectric pattern 222. The connection through structure 227 may be laterally spaced apart from the second memory signal structure 225M. The connection through structure 227 may have a bottom surface in direct contact with a top surface of the first contact plug 216. The connection through structure 227 may be directly connected to the first contact plug 216.

The first dummy chip 310 may be disposed on the top surface of the second lower integrated circuit chip 220. The first dummy chip 310 may be directly bonded to the second lower integrated circuit chip 220. The first dummy chip 310 may include a first conductive structure 318 and a second conductive structure 319 in addition to the first dielectric layer 312 and the first through structure 215. The first dielectric layer 312 may include a plurality of first dielectric layers 312. When viewed in plan, the first and second conductive structures 318 and 319 may overlap the central region CR of the first semiconductor substrate 211. Each of the first and second conductive structures 318 and 319 may include via parts and a line part. The line part may be disposed between the first dielectric layers 312. Each of the via parts may penetrate at least one of the first dielectric layers 312 and may be coupled to the line part.

The first conductive structure 318 may be connected to the connection through structure 227 and one of the second memory signal structure 225M. For example, a portion of the first conductive structure 318 may be directly connected to the connection through structure 227, and another portion of the first conductive structure 318 may be directly connected to the second memory signal structure 225M. Therefore, the first integrated circuits 214 may be electrically connected to the package substrate 100 through the first contact plug 216, the connection through structure 227 the first conductive structure 318, and the second memory signal structure 225M, and the first memory signal structure 215M. The first lower integrated circuit chip 210 may be electrically connected through the package substrate 100 to the upper integrated circuit chip 400 or an external apparatus.

The second conductive structure 319 may be directly connected to the second contact plug 226 and the other of the second memory signal structure 225M. Therefore, the second integrated circuits 224 may be electrically connected to the package substrate 100 through the second contact plug 226, the second conductive structure 319, a corresponding second memory signal structure 225M, and a corresponding first memory signal structure 215M. The second lower integrated circuit chip 220 may be electrically connected through the package substrate 100 to the upper integrated circuit chip 400 or an external apparatus.

As shown in FIG. 3B, the first signal via 315S may include a plurality of first signal vias 315S that are connected to each other. The first signal vias 315S may penetrate corresponding first dielectric layers 312. For example, each of a plurality of first signal vias 315S may have top and bottom surfaces that are coplanar with respective top and bottom surfaces of a corresponding one of the first dielectric layers 312. Differently from that shown, in some embodiments, a single first signal via 315S may penetrate a plurality of first dielectric layers 312. The following will describe in detail the upper integrated circuit chip 400.

The upper integrated circuit chip 400 may include the chip pad 450, the upper semiconductor substrate 410, the wiring line layer 430, and the upper integrated circuits 404. The chip pad 450, the upper semiconductor substrate 410, the wiring line layer 430, and the upper integrated circuits 404 may be substantially the same as those discussed above. For example, the upper integrated circuits 404 may be disposed on a first surface of the upper semiconductor substrate 410. A structure and type of the upper integrated circuits 404 may be variously changed without being limited to that shown. In some embodiments, the first surface of the upper semiconductor substrate 410 may correspond to a bottom surface. For example, the bottom surface of the upper semiconductor substrate 410 may serve as an active layer. The wiring line layer 430 may include an upper dielectric pattern 412, a third contact plug 416, third dielectric layers 422, and an upper conductive structure 425. On the first surface of the upper semiconductor substrate 410, the upper dielectric pattern 412 may cover the upper integrated circuits 404. The upper dielectric pattern 412 may include a silicon-based dielectric material. The third contact plug 416 may penetrate the upper dielectric pattern 412 and may have electrical connection with the upper integrated circuits 404. The third contact plug 416 may include a conductive material, such as metal. The third dielectric layers 422 may be stacked on a bottom surface of the upper dielectric pattern 412. The third dielectric layers 422 may include a silicon-based dielectric material or a polymer. The third dielectric layers 422 may be provided therein with the upper conductive structure 425 electrically connected to the third contact plug 416 and the chip pad 450. The upper conductive structure 425 may include, for example, metal. The upper conductive structure 425 may include a line part and a via part. The line part may be provided between the third dielectric layers 422. The via part may penetrate at least one of the third dielectric layers 422 and may be connected to the line part. The chip pad 450 may be electrically connected to the upper integrated circuit 404 through the upper conductive structure 425 and the third contact plug 416.

The upper integrated circuits 404, the upper dielectric pattern 412, and the third contact plug 416 may correspond to a front-end-of-line (FEOL) layer of the upper integrated circuit chip 400. The third dielectric layers 422 and the upper conductive structure 425 may correspond to a hack-end-of-line (BEOL) layer of the upper integrated circuit chip 400.

FIG. 4 illustrates a cross-sectional view showing a semiconductor package according to example embodiments. Duplicate descriptions will be omitted below.

Referring to FIG. 4, a semiconductor package 13 may include a package substrate 100, a first lower integrated circuit chip 210, a second lower integrated circuit chip 220, a first dummy chip 310, a second dummy chip 320, and an upper integrated circuit chip 400. The semiconductor package 13 may further include an under-fill layer 530 and a molding layer 500. Unless otherwise specified below, the first dummy chip 310, the second dummy chip 320, the upper integrated circuit chip 400, the under-fill layer 530, and the molding layer 500 may be substantially the same as those discussed above.

The first dummy chip 310 may include a plurality of first dielectric layers 312 and a first connection structure 1315. The first dielectric layers 312 may be stacked on the second lower integrated circuit chip 220. A lowermost one of the first dielectric layers 312 may be in direct contact with the top surface of the first lower integrated circuit chip 210. For example, the lowermost first dielectric layer 312 may be directly bonded to the first dielectric pattern (see, e.g., the first dielectric pattern 212 of FIG. 3B) of the first lower integrated circuit chip 210.

The first connection structure 1315 may be provided in the first dielectric layers 312. The first connection structure 1315 may include first conductive vias 315' and a first conductive line 316. The first conductive line 316 may be interposed between the first dielectric layers 312. The first conductive line 316 may extend horizontally. For example, the first conductive line 316 may have a major axis that extends in a direction parallel to the bottom surface of the first lower integrated circuit chip 210. Each of the first conductive vias 315' may penetrate at least one of the first dielectric layers 312 and may be coupled to the first conductive line 316. For example, like the first signal via 315S discussed with reference to FIG. 1, each of the first conductive vias 315' may serve as a signal transmission path for the upper integrated circuit chip 400.

The first connection structure 1315 may have a bottom surface exposed on the bottom surface of the first lower integrated circuit chip 210. The bottom surface of the first connection structure 1315 may be directly bonded to the top surface of the second through structure 225 and the first connection structure 1315 may be electrically connected to the second through structure 225. For example, a lowermost one of the first conductive vias 315' may be directly connected to the second through structure 225. According to example embodiments, because the first conductive line 316 is provided, an uppermost first conductive via 315' may be more freely disposed. For example, the uppermost first conductive via 315' may not be vertically aligned with any of the second through structure 225 and the lowermost first conductive via 315'.

The second dummy chip 320 may include a plurality of second dielectric layers 322 and a second connection structure 1325. The second dielectric layers 322 may be stacked on the first dummy chip 310. A lowermost one of the second dielectric layers 322 may be directly bonded to an uppermost one of the first dielectric layers 312.

The second connection structure 1325 may be provided in the second dielectric layers 322. The second connection structure 1325 may include second conductive vias 325' and a second conductive line 326. The second conductive line 326 may be interposed between the second dielectric layers 322. The second conductive line 326 may extend horizontally. For example, the second conductive line 326 may have a major axis that extends in a direction parallel to the bottom surface of the second lower integrated circuit chip 220. Each of the second conductive vias 325' may penetrate at least one of the second dielectric layers 322 and may be coupled to the second conductive line 326. Like the second signal via 325S discussed with reference to FIG. 1, each of the second conductive vias 325' may serve as signal transmission path for the upper integrated circuit chip 400. Because the second conductive line 326 is provided, an uppermost second conductive via 325' may be more freely disposed. For example, the uppermost second conductive via 325' may not be vertically aligned with any of the second through structure 225 and a lowermost second conductive via 325'.

The second connection structure 1325 may have a bottom surface exposed on the bottom surface of the second lower integrated circuit chip 220. The bottom surface of the second connection structure 1325 may be directly bonded to a top surface of the first connection structure 1315, and the second connection structure 1325 may thus be electrically connected to the first connection structure 1315. For example, the lowermost second conductive via 325' may be directly bonded to the uppermost first conductive via 315'. According to some embodiments, because the first connection structure 1315 is provided, the second connection structure 1325 may be more freely disposed.

The upper integrated circuit chip 400 may be disposed on and in direct contact with the top surface of the second dummy chip 320. For example, a third dielectric layer (not shown) including the wiring line layer 430 may be directly bonded to an uppermost second dielectric layer 322. The chip pad 450 of the upper integrated circuit chip 400 may be directly bonded to an uppermost surface of the second connection structure 1325. For example, the chip pad 450 may be directly coupled to the uppermost second conductive via 325'. Therefore, the upper integrated circuit chip 400 may be electrically connected to the package substrate 100 through the first and second connection structures 1315 and 1325 and through the first and second through structures 215 and 225. The first and second connection structures 1315 and 1325 may serve as signal transmission paths for the upper integrated circuit chip 400.

According to some embodiments, because the first and second connection structures 1315 and 1325 are provided, the chip pad 450 may be more freely disposed on the upper integrated circuit chip 400. For example, the chip pad 450 may not be vertically aligned with the second through structure 225. Therefore, the upper integrated circuits (see, e.g., the upper integrated circuits 404 of FIG. 3B) may be more freely designed on the upper integrated circuit chip 400.

The package substrate 100, the first lower integrated circuit chip 210, and the second lower integrated circuit chip 220 may be substantially the same as those discussed above with reference to FIGS. 1, 2, 3A, and 3B.

Figure 5:
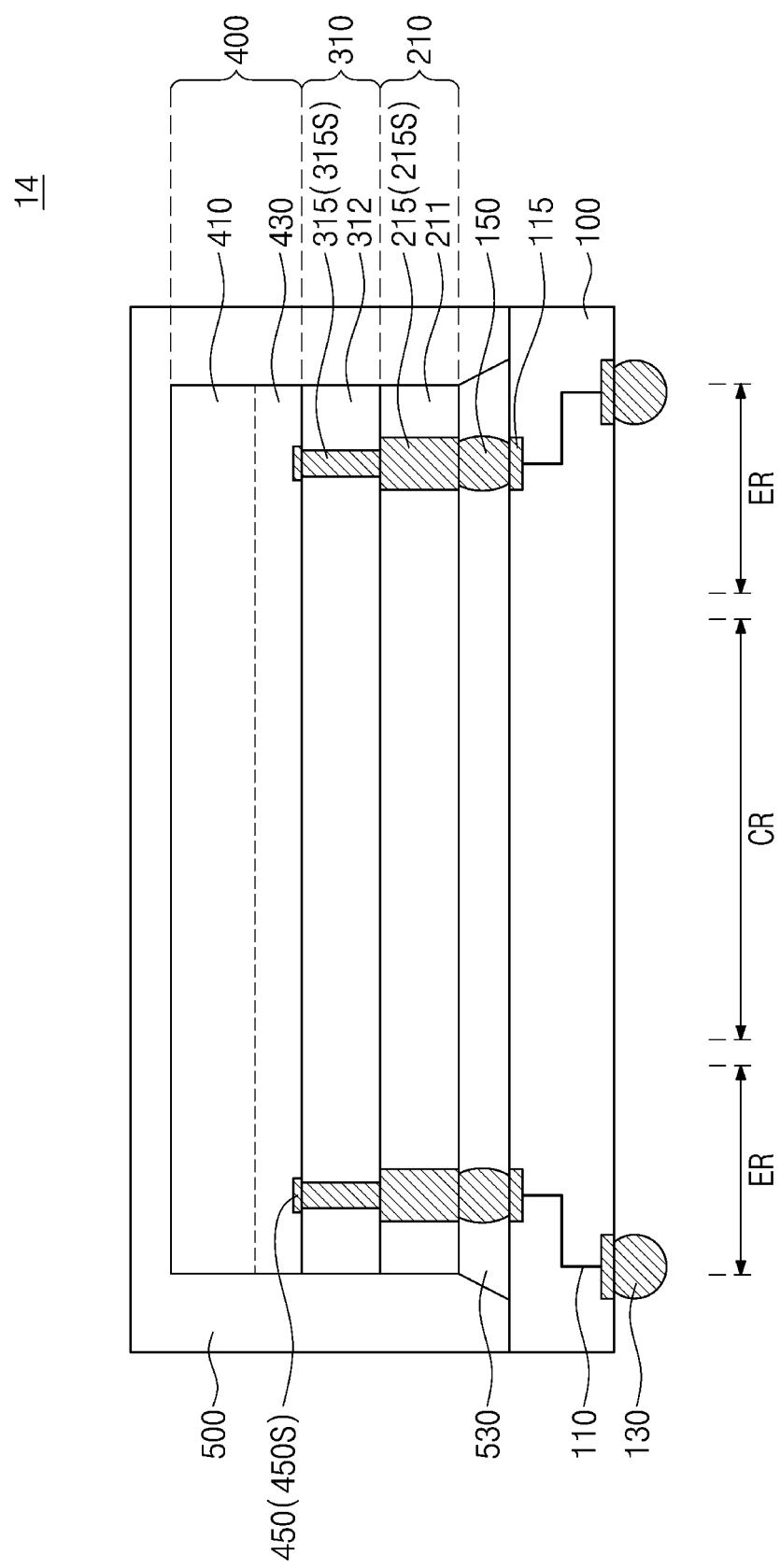
FIG. 5 illustrates a cross-sectional view showing a semiconductor package, according to example embodiments.

FIG. 5 illustrates a cross-sectional view showing a semiconductor package according to example embodiments. Duplicate descriptions will be omitted below.

Referring to FIG. 5, a semiconductor package 14 may include a package substrate 100, a first lower integrated circuit chip 210, a first dummy chip 310, and an upper integrated circuit chip 400. The semiconductor package 14 may further include an under-fill layer 530 and a molding layer 500. The package substrate 100, the first lower integrated circuit chip 210, the first dummy chip 310, and the upper integrated circuit chip 400 may be substantially the same as those discussed above. In contrast, in FIG. 5, the first dummy chip 310 may be in direct contact with the top surface of the first lower integrated circuit chip 210. The first dummy chip 310 may be directly bonded to the first lower integrated circuit chip 210. The first conductive via 315 may be directly bonded to the first through structure 215.

The upper integrated circuit chip 400 may be disposed on and in direct contact with the top surface of the first dummy chip 310. The upper integrated circuit chip 400 may be directly bonded to the first dummy chip 310. The chip pad 450 of the upper integrated circuit chip 400 may be directly bonded to the first conductive via 315.

The number of stacked lower integrated circuit chips 210 and 220 and of stacked dummy chips 310 and 320 may be variously changed in the semiconductor package 10 of FIG. 1, the semiconductor package 11 of FIG. 2, the semiconductor package 12 of FIGS. 3A and 3B, and the semiconductor package 13 of FIG. 4. For example, as illustrated in FIG. 5, the second lower integrated circuit chip 220 and the second dummy chip 320 may be omitted, and the first dummy chip 310 may be directly bonded to the first lower integrated circuit chip 210 and the upper integrated circuit chip 400. As another example, a third lower integrated circuit chip (not shown) may further be provided between the first and second lower integrated circuit chips 210 and 220, and may thus be directly bonded to the first and second lower integrated circuit chips 210 and 220. As another example, a third dummy chip (not shown) may further be provided between the first and second dummy chips 310 and 320, and may thus be directly bonded to the first and second dummy chips 310 and 320. A total number of the lower integrated circuit chips 210 and 220 may be the same as or different from that of the dummy chips 310 and 320.

FIGS. 6A to 6F illustrate cross-sectional views showing a method of fabricating a semiconductor package according to some example embodiments. Duplicate descriptions will be omitted below.

Figure 6A:
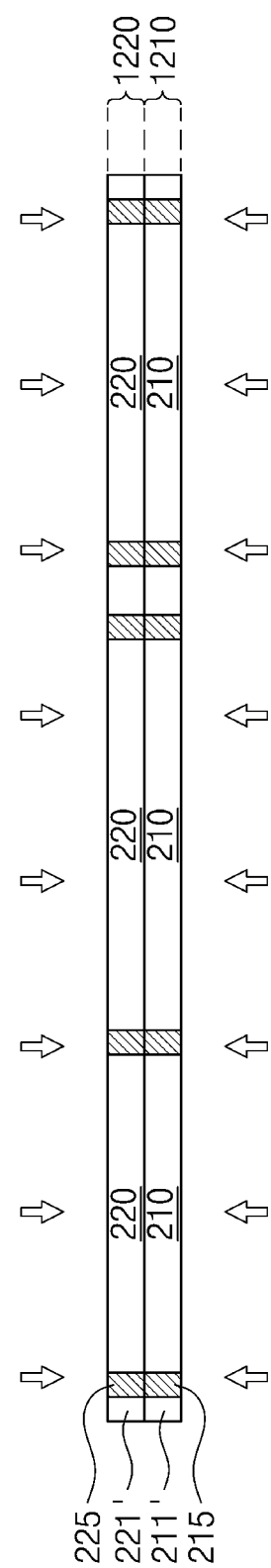
FIGS. 6A to 6F illustrate cross-sectional views showing a method of fabricating a semiconductor package, according to example embodiments.

Referring to FIG. 6A, a first preliminary semiconductor chip 1210 and a second preliminary semiconductor chip 1220 may be prepared. The first preliminary semiconductor chip 1210 may be a wafer-level semiconductor chip, which may include a plurality of connected first lower integrated circuit chips 210. The plurality of connected first lower integrated circuit chips 210 may be a plurality of first lower integrated circuit chips 210 that are adjacent to one another in the horizontal direction and which have not been separated from one another. The first preliminary semiconductor chip 1210 may include a first semiconductor substrate 211', first integrated circuits (not shown), and a first through structure 215. The first semiconductor substrate 211' may be substantially the same as the first semiconductor substrate 211 discussed above in FIG. 1. In some embodiments, the first semiconductor substrate 211' may be a wafer-level substrate, or a wafer-level semiconductor wafer. The first integrated circuits and the first through structure 215 may be substantially the same respectively as the first integrated circuits 214 and the first through structure 215 discussed above in FIGS. 1 and 3B. Although not shown, a first dielectric pattern (see, e.g., the first dielectric pattern 212 of FIG. 3B) may further be provided on a top surface of the first semiconductor substrate 211'.

The second preliminary semiconductor chip 1220 may be a wafer-level semiconductor chip, which may include a plurality of connected second lower integrated circuit chips 220. The plurality of connected second lower integrated circuit chips 220 may be a plurality of second lower integrated circuit chips 220 that are adjacent to one another in the horizontal direction and which have not been separated from one another by, for example, a sawing process. The second preliminary semiconductor chip 1220 may include a second semiconductor substrate 221', second integrated circuits (not shown), and a second through structure 225. The second semiconductor substrate 221' may be substantially the same as the second semiconductor substrate 221 discussed above with reference to FIG. 1. In some embodiments, the second semiconductor substrate 221' may be a wafer-level substrate, or a wafer-level semiconductor wafer. The second integrated circuits (not shown) and the second through structure 225 may be substantially the same respectively as the second integrated circuits 224 and the second through structure 225 discussed above in FIGS. 1 and 3B. Although not shown, a second lower dielectric pattern (see, e.g., the second lower dielectric pattern 223 of FIG. 3B) may further be provided on a bottom surface of the second semiconductor substrate 221'.

According to some embodiments, a direct bonding process may be performed on the first and second preliminary semiconductor chips 1210 and 1220. The direct bonding process may include a first plasma treatment process, a second plasma treatment process, and a joining process. The first plasma treatment process may be performed on a top surface of the first preliminary semiconductor chip 1210. The second plasma treatment process may be performed on a bottom surface of the second preliminary semiconductor chip 1220. The second preliminary semiconductor chip 1220 may be disposed on the first preliminary semiconductor chip 1210. At this stage, the plasma-treated bottom surface of the second preliminary semiconductor chip 1220 may be in contact with the plasma-treated top surface of the first preliminary semiconductor chip 1210. The joining process may include applying heat and/or pressure to the first and second preliminary semiconductor chips 1210 and 1220. Therefore, a chemical bond may be formed between the first dielectric pattern (see, e.g., the first dielectric pattern 212 of FIG. 3B) of the first preliminary semiconductor chip 1210 and the second lower dielectric pattern (see, e.g., the second lower dielectric pattern 223 of FIG. 3B) of the second preliminary semiconductor chip 1220. The first through structure 215 may be melted at its top surface and the second through structure 225 may be melted at its bottom surface, with the result that the melted top surface of the first through structure 215 may be joined with the melted bottom surface of the second through structure 225. Accordingly, the second preliminary semiconductor chip 1220 may be directly bonded to the first preliminary semiconductor chip 1210. Although not shown, the direct bonding process may be performed on a carrier substrate.

Figure 6B:
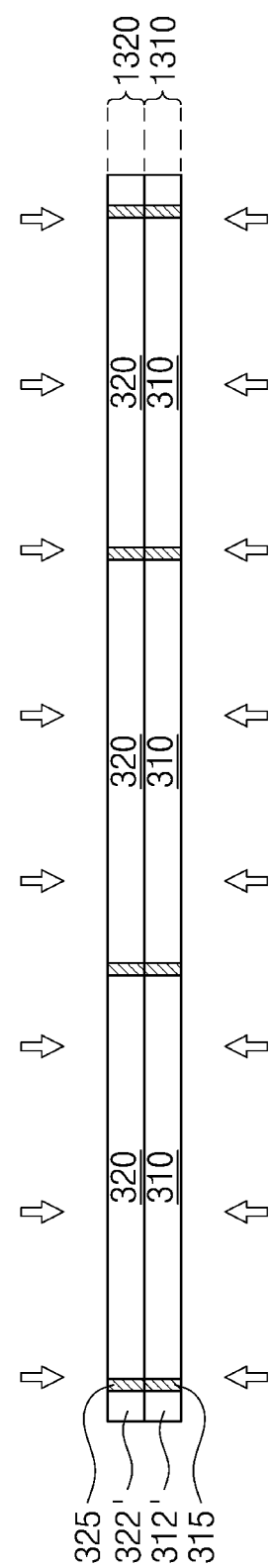

Referring to FIG. 6B, a first preliminary dummy chip 1310 and a second preliminary dummy chip 1320 may be prepared. The first preliminary dummy chip 1310 may be a wafer-level chip, which may include a plurality of connected first dummy chips 310. The plurality of connected first dummy chips 310 may be a plurality of first dummy chips 310 that are adjacent to one another in the horizontal direction and which have not been separated from one another by, for example, a sawing process. The first preliminary dummy chip 1310 may include a first dielectric layer 312' and first conductive vias 315, but may not include integrated circuits. The first dielectric layer 312' and the first conductive via 315' may be substantially the same respectively as the first dielectric layer 312 and the first conductive via 315 discussed above with reference to FIG. 1. In contrast, the first dielectric layer 312' may be a wafer-level dielectric layer.

The second preliminary dummy chip 1320 may be a wafer-level chip, which may include a plurality of connected second dummy chips 320. The plurality of connected second dummy chips 320 may be a plurality of second dummy chips 320 that are adjacent to one another in the horizontal direction and which have not been separated from one another by, for example, a sawing process. The second preliminary dummy chip 1320 may include a second dielectric layer 322' and second conductive vias 325, but may not include integrated circuits. The second dielectric layer 322' and the second conductive via 325 may be substantially the same respectively as the second dielectric layer 322 and the second conductive via 325 discussed above with reference to FIG. 1. In some embodiments, the second dielectric layer 322' may be a wafer-level dielectric layer.

According to some embodiments, a direct bonding process may be performed on the first and second preliminary dummy chips 1310 and 1320. For example, a plasma treatment process may be performed on a top surface of the first preliminary dummy chip 1310. The plasma treatment process may be performed on a bottom surface of the second preliminary dummy chip 1320. The second preliminary dummy chip 1320 may be disposed on the first preliminary dummy chip 1310. At this stage, the plasma-treated bottom surface of the second preliminary dummy chip 1320 may be in contact with the plasma-treated top surface of the first preliminary dummy chip 1310. A joining process may include applying heat and/or pressure to the first and second preliminary dummy chips 1310 and 1320. Therefore, a chemical bond may be formed between the first dielectric layer 312' of the first preliminary dummy chip 1310 and the second dielectric layer 322' of the second preliminary dummy chip 1320. The heat and/or pressure may melt a top surface of the first conductive via 315 and a bottom surface of the second conductive via 325, with the result that the melted top surface of the first conductive via 315 may be joined with the melted bottom surface of the second conductive via 325. Accordingly, the second preliminary dummy chip 1320 may be directly bonded to the first preliminary dummy chip 1310.

Figure 6C:
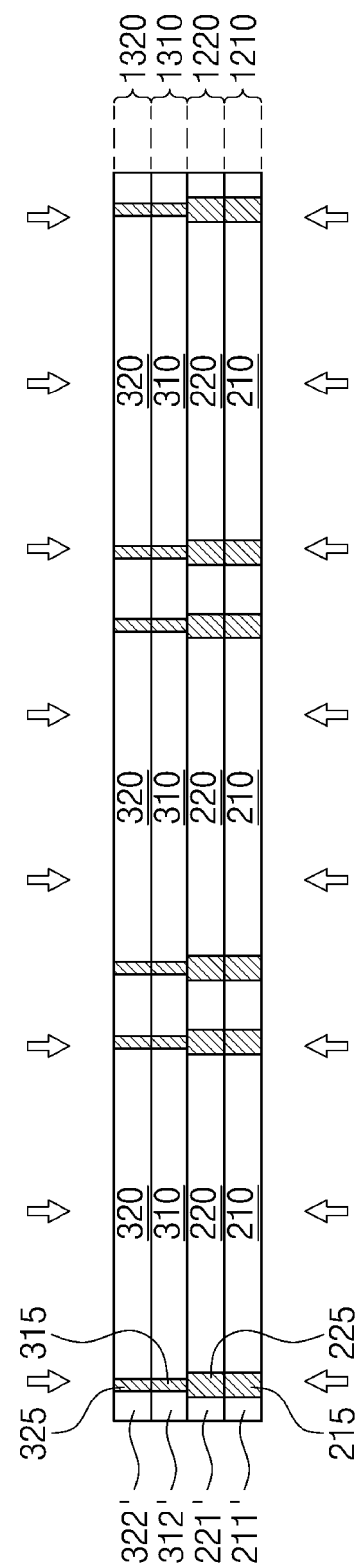

Referring to FIG. 6C, there may be prepared the first and second preliminary semiconductor chips 1210 and 1220 that are directly bonded to each other. As discussed above with reference to FIG. 6A, a direct bonding process may be performed on the first and second preliminary semiconductor chips 1210 and 1220. There may be prepared the first and second preliminary dummy chips 1310 and 1320 that are directly bonded to each other. As discussed above with reference to FIG. 6B, a direct bonding process may be performed on the first and second preliminary dummy chips 1310 and 1320.

According to some embodiments, a direct bonding process may be performed on the second preliminary semiconductor chip 1220 and the first preliminary dummy chip 1310. For example, a plasma treatment process may be performed on a top surface of the second preliminary semiconductor chip 1220 and a bottom surface of the first preliminary dummy chip 1310. The second preliminary dummy chip 1320 may be disposed on the first preliminary dummy chip 1310 to cause the plasma-treated bottom surface of the first preliminary dummy chip 1310 to contact the plasma-treated top surface of the second preliminary semiconductor chip 1220.

Heat and/or pressure may be applied to the second preliminary semiconductor chip 1220 and the first preliminary dummy chip 1310, and thus the second preliminary semiconductor chip 1220 may be directly jointed with the first preliminary dummy chip 1310. Accordingly, a chemical bond may be formed between the first dielectric layer 312' of the first preliminary dummy chip 1310 and a second upper dielectric pattern (see, e.g., the second upper dielectric pattern 222 of FIG. 3B) of the second preliminary semiconductor chip 1220. The heat and/or pressure may melt a bottom surface of the first conductive via 315 and a top surface of the second through structure 225, with the result that the melted bottom surface of the first conductive via 315 may be jointed with the melted top surface of the second through structure 225. Accordingly, the first preliminary dummy chip 1310 may be directly bonded to the second preliminary semiconductor chip 1220.

Figure 6D:
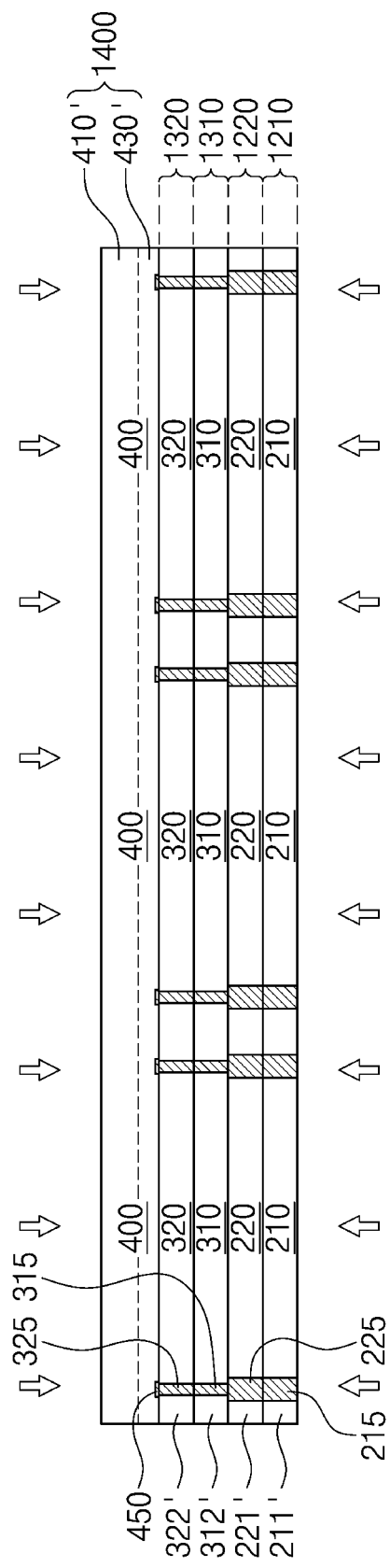

Referring to FIG. 6D, a preliminary upper semiconductor chip 1400 may be directly bonded to a top surface of the second preliminary dummy chip 1320. First, the preliminary upper semiconductor chip 1400 may be prepared. The preliminary upper semiconductor chip 1400 may be a wafer-level semiconductor chip, which may include a plurality of connected upper integrated circuit chips 400. The plurality of connected upper integrated circuit chips 400 may be a plurality of upper integrated circuit chips 400 that are adjacent to one another in the horizontal direction and which have not been separated from one another by, for example, a sawing process. The preliminary upper semiconductor chip 1400 may include an upper semiconductor substrate 410', a wiring line layer 430', upper integrated circuits (not shown), and a chip pad 450. The upper semiconductor substrate 410' may be substantially the same as the upper semiconductor substrate 410 discussed above in FIG. 1. In contrast, the upper semiconductor substrate 410' may be a wafer-level substrate, or a wafer-level semiconductor wafer. The wiring line layer 430' may be a wafer-level wiring line layer. Although not shown, the wiring line layer 430' may include the third dielectric layers 422 and the conductive structure 425 discussed with reference to FIG. 3B.

A plasma treatment process may be performed on the top surface of the second preliminary dummy chip 1320 and a bottom surface of the preliminary upper semiconductor chip 1400. The preliminary upper semiconductor chip 1400 may be disposed on the second preliminary dummy chip 1320 to cause the plasma-treated bottom surface of the preliminary upper semiconductor chip 1400 to contact the plasma-treated top surface of the second preliminary dummy chip 1320. Heat and/or pressure may be applied to the preliminary upper semiconductor chip 1400 and the second preliminary dummy chip 1320, and thus the preliminary upper semiconductor chip 1400 may be directly jointed with the second preliminary dummy chip 1320. Accordingly, a chemical bond may be formed between a lowermost third dielectric layer (see, e.g., the lowermost third dielectric layer 422 of FIG. 3B) of the wiring line layer 430' and the second dielectric layer 322' of the second preliminary dummy chip 1320. The heat and/or pressure may melt a top surface of the second conductive via 325 and a bottom surface of the chip pad 450, with the result that the melted top surface of the second conductive via 325 may be joined with the melted bottom surface of the chip pad 450. Accordingly, the preliminary upper semiconductor chip 1400 may be directly bonded to the second preliminary dummy chip 1320.

Figure 6E:
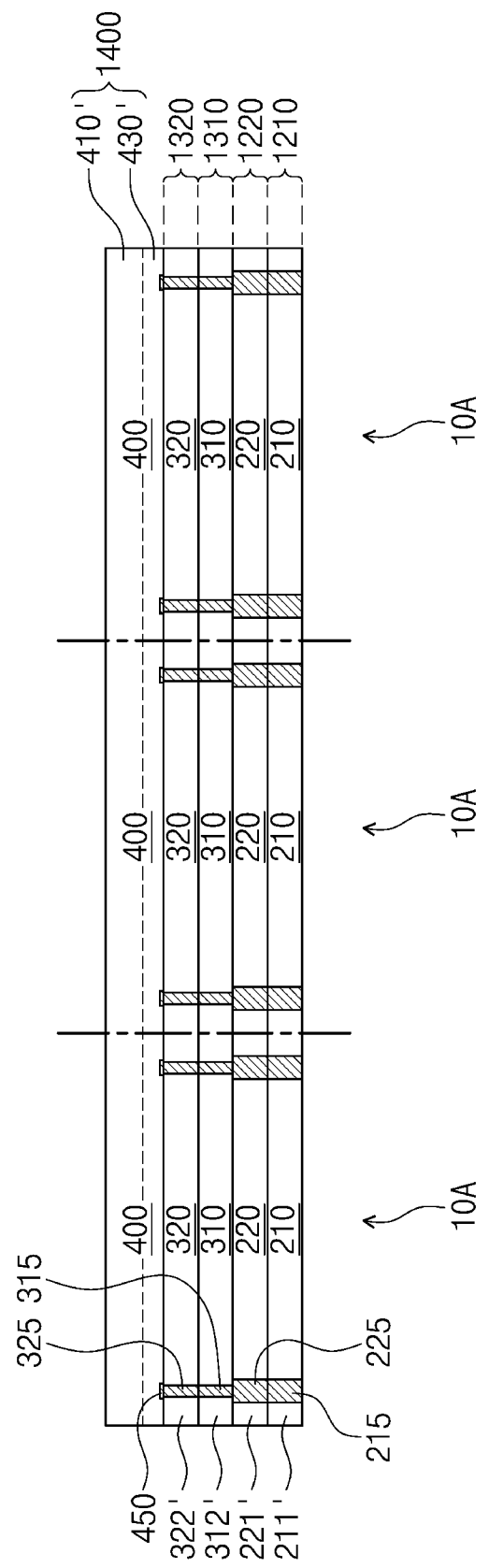

Referring to FIG. 6E, a sawing process may be performed on the preliminary upper semiconductor chip 1400, the first and second preliminary dummy chips 1310 and 1320, and the first and second preliminary semiconductor chips 1210 and 1220. The sawing process may include using a blade, a cutting wheel, or a laser to dice the preliminary upper semiconductor chip 1400, the first and second preliminary dummy chips 1310 and 1320, and the first and second preliminary semiconductor chips 1210 and 1220. The sawing process may form a plurality of separated chip stacks 10A. Each of the chip stacks 10A may include first and second lower integrated circuit chips 210 and 220, first and second dummy chips 310 and 320, and an upper integrated circuit chip 400.

Referring back to FIG. 6F, the chip stack 10A may be mounted on a package substrate 100. The mounting of the chip stack 10A may include placing the chip stack 10A on the package substrate 100 to cause the first lower integrated circuit chip 210 to face the package substrate 100, and forming a connection terminal 150. The connection terminal 150 may be formed between a first through structure 215 and a substrate pad 115. The formation of the connection terminal 150 may electrically connect the chip stack 10A to the package substrate 100. For example, the first and second lower integrated circuit chips 210 and 220 and the upper integrated circuit chip 400 may be electrically connected to the package substrate 100. Through the examples discussed above, a semiconductor package may be fabricated in a wafer-on-wafer (WOW) process.

Figure 6F:
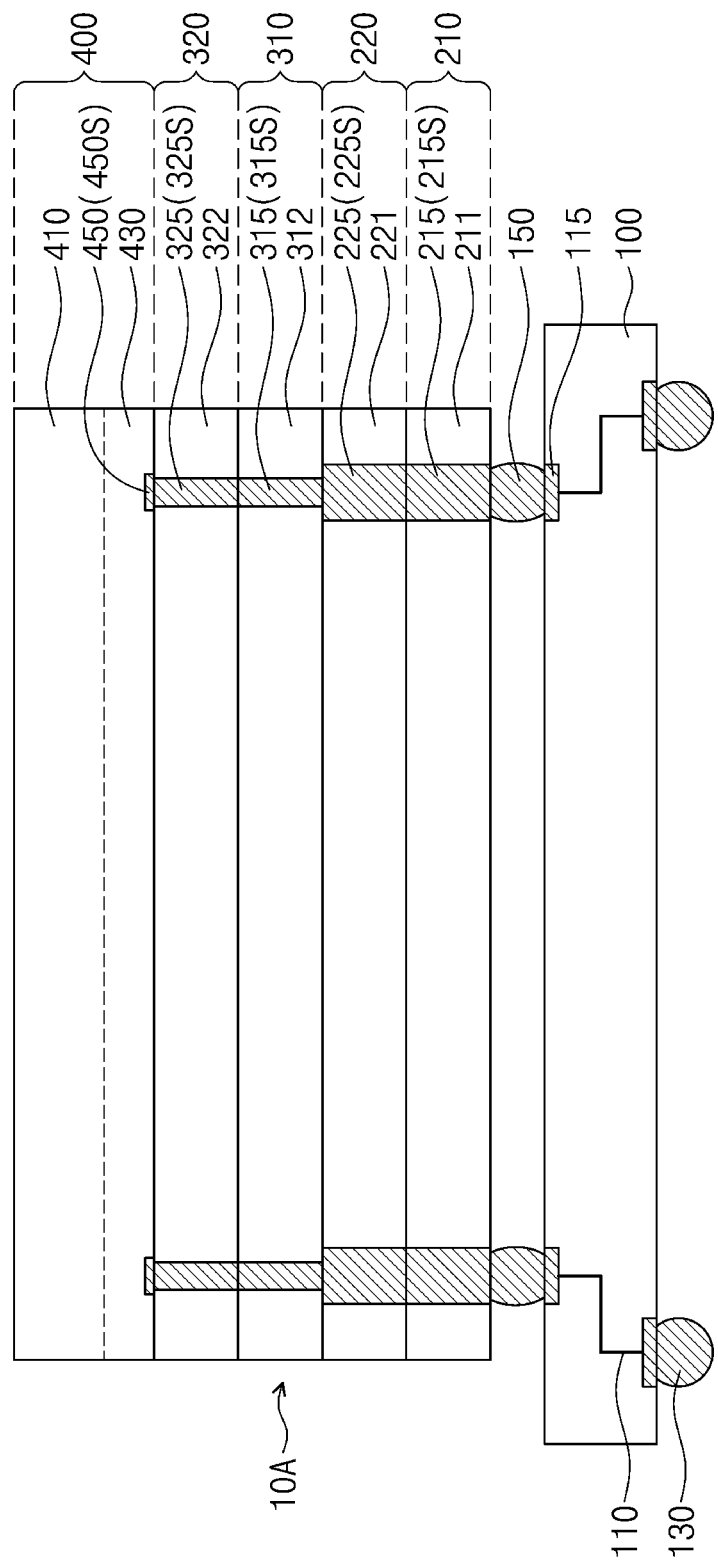

Referring to FIGS. 6F and 1, an under-fill layer 530 and a molding layer 500 may further be formed on the package substrate 100, and thus the semiconductor package 10 of FIG. 1 may be eventually fabricated.

A method substantially the same as that discussed with reference to FIGS. 6A to 6F may fabricate the semiconductor package 11 discussed above with reference to FIG. 2, the semiconductor package 12 discussed above with reference to FIGS. 3A and 3B, the semiconductor package 13 discussed above with reference to FIG. 4, or the semiconductor package 14 discussed with reference to FIG. 5. For example, the first and second lower integrated circuit chips 210 and 220 may be directly bonded by the direct bonding process on the first and second preliminary semiconductor chips 1210 and 1220 discussed with reference to FIG. 6A, the first and second dummy chips 310 and 320 may be directly bonded by the direct bonding process on the first and second preliminary dummy chips 1310 and 1320 discussed with reference to FIG. 6B, the second lower integrated circuit chip 220 and the first dummy chip 310 may be directly bonded by the direct bonding process on the second preliminary semiconductor chip 1220 and the first preliminary dummy chip 1310 discussed with reference to FIG. 6C, and the second dummy chip 320 and the upper integrated circuit chip 400 may be directly bonded by the direct bonding process on the second preliminary dummy chip 1320 and the preliminary upper semiconductor chip 1400 discussed with reference to FIG. 6D. Afterwards, a sawing process may be performed to form the chip stack 10A, and the chip stack 10A may be mounted on the package substrate 100.

According to the present inventive concepts, an upper integrated circuit chip may be a logic chip. The upper integrated circuit chip may be an uppermost one of stacked chips. Therefore, when a semiconductor package operates, heat may be promptly discharged from the upper integrated circuit chip and thus the semiconductor package may increase in operational reliability.

The upper integrated circuit chip may be electrically connected to a package substrate through a conductive via of a dummy chip and a through structure of a lower integrated circuit chip. Accordingly, an electrical path may be reduced between the upper integrated circuit chip and the package substrate, and as a result the semiconductor package may increase in performance and operating speed.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A semiconductor package, comprising:
   a first memory chip including a first semiconductor substrate and a first through structure that penetrates the first semiconductor substrate;
   a second memory chip having a lower planar surface in direct contact with an upper planar surface of the first memory chip, the second memory chip including a second semiconductor substrate and a second through structure that penetrates the second semiconductor substrate;
   a first dummy chip having a lower planar surface in direct contact with an upper planar surface of the second memory chip, the first dummy chip including a first conductive via;
   a second dummy chip having a lower planar surface in direct contact with an upper planar surface of the first dummy chip, the second dummy chip including a second conductive via; and
   a logic chip having a lower planar surface in direct contact with an upper planar surface of the second dummy chip,
   wherein the logic chip is electrically connected to the first through structure through the second conductive via, the first conductive via, and the second through structure.

2. The semiconductor package of claim 1, wherein, when viewed in plan,
   the first semiconductor substrate has a central region and an edge region that surrounds the central region,
   the first through structure is provided in the edge region of the first semiconductor substrate, and
   the second through structure, the first conductive via, and the second conductive via overlap the edge region of the first semiconductor substrate.

3. The semiconductor package of claim 2,
   wherein the first conductive via includes a first signal via,
   wherein the second conductive via includes a second signal via,
   wherein the first through structure includes a first signal structure, and
   wherein the second through structure includes a second signal structure.

4. The semiconductor package of claim 3, wherein the first signal via, the second signal via, the first signal structure, and the second signal structure do not overlap the central region of the first semiconductor substrate.

5. The semiconductor package of claim 3,
   wherein the first conductive via further includes a first ground/power via that is electrically separated from the first signal via,
   wherein the second conductive via further includes a second ground/power via that is electrically separated from the second signal via,
   wherein the first through structure further includes a first ground/power structure that is electrically separated from the first signal structure,
   wherein the second through structure further includes a second ground/power structure that is electrically separated from the second signal structure, and
   wherein the first ground/power via is provided on the central region of the first semiconductor substrate.

6. The semiconductor package of claim 5, wherein the second ground/power structure, the first ground/power structure, and the second ground/power via are vertically aligned with the first ground/power via.

7. The semiconductor package of claim 1,
   wherein the first memory chip does not include a back-end-of-line (BEOL) layer, and
   wherein the second memory chip does not include a back-end-of-line (BEOL) layer.

8. The semiconductor package of claim 1,
   wherein the first dummy chip does not include an integrated circuit, and
   wherein the second dummy chip does not include an integrated circuit.

9. The semiconductor package of claim 1, wherein a width of the first conductive via is less than a width of the first through structure and less than a width of the second through structure.

10. The semiconductor package of claim 9, wherein a width of the second conductive via is less than the width of the first through structure and less than the width of the second through structure.

11. The semiconductor package of claim 1, further comprising:
    a package substrate; and
    a connection terminal between the first memory chip and a top surface of the package substrate.

12. The semiconductor package of claim 1,
    wherein the second conductive via is in direct contact with the first conductive via,
    wherein the first conductive via is in direct contact with the second through structure, and
    wherein the second through structure is in direct contact with the first through structure.

13. A semiconductor package, comprising:
    a package substrate;
    a first lower integrated circuit chip on the package substrate, the first lower integrated circuit chip including a first semiconductor substrate, first integrated circuits, and a first signal through structure;
    a second lower integrated circuit chip in direct contact with a top surface of the first lower integrated circuit chip, the second lower integrated circuit chip including a second semiconductor substrate, second integrated circuits, and a second signal through structure that penetrates the second semiconductor substrate;
    a dummy chip in direct contact a top surface of the second lower integrated circuit chip, the dummy chip including a signal via; and
    an upper integrated circuit chip on a top surface of the dummy chip, the upper integrated circuit chip including an upper semiconductor substrate and upper integrated circuits, wherein the upper integrated circuits are of a different type from the first integrated circuits and the second integrated circuits, wherein the first signal through structure, the second signal through structure, and the signal via overlap an edge region of the first semiconductor substrate, and wherein the upper integrated circuit chip is electrically connected to the first signal through structure through the signal via and the second signal through structure.

14. The semiconductor package of claim 13, wherein the first lower integrated circuit chip does not include a back-end-of-line (BEOL) layer, wherein the second lower integrated circuit chip does not include a back-end-of-line (BEOL) layer, and wherein the dummy chip does not include integrated circuits.

15. The semiconductor package of claim 13, wherein a width of the signal via is less than a width of the first signal through structure and less than a width of the second signal through structure.

16. The semiconductor package of claim 13, wherein each of the first and second lower integrated circuit chips includes a memory chip, and wherein the upper integrated circuit chip includes a logic chip.

17. The semiconductor package of claim 13, wherein the first lower integrated circuit chip further includes a first through memory structure that penetrates a central region of the first semiconductor substrate, and wherein the first through memory structure is electrically connected to the second integrated circuits and is electrically separated from the first signal through structure.

18. A semiconductor package, comprising:

a first lower integrated circuit chip including a first semiconductor substrate, first memory circuits, and a first signal through structure that penetrates the first semiconductor substrate;

a second lower integrated circuit chip in direct contact with a top surface of the first lower integrated circuit chip, the second lower integrated circuit chip including a second semiconductor substrate, second memory circuits, and a second signal through structure that penetrates the second semiconductor substrate;

a first dummy chip in direct contact with a top surface of the second lower integrated circuit chip, the first dummy chip including a first signal via;

a second dummy chip in direct contact with a top surface of the first dummy chip, the second dummy chip including a second signal via; and an upper integrated circuit chip in direct contact with a top surface of the second dummy chip, the upper integrated circuit chip including an upper semiconductor substrate and logic circuits, wherein, when viewed in plan, the first signal through structure is provided on an edge region of the first semiconductor substrate, wherein the second signal through structure is aligned with the first signal through structure, wherein, when viewed in plan, the first signal via and the second signal via overlap the edge region of the first semiconductor substrate, and wherein the upper integrated circuit chip is electrically connected to the first signal through structure through the second signal via, the first signal via, and the second signal through structure.

19. The semiconductor package of claim 18, wherein each of the first and second dummy chips does not include an integrated circuit, and wherein each of the first and second lower integrated circuit chips does not include a back-end-of-line (BEOL) layer.

20. The semiconductor package of claim 18, further comprising:

a package substrate; and a connection terminal between the first lower integrated circuit chip and a top surface of the package substrate.

* * * * *